(12) United States Patent
Weingarten et al.

(10) Patent No.: US 8,341,335 B2
(45) Date of Patent: Dec. 25, 2012

(54) FLASH MEMORY APPARATUS WITH A HEATING SYSTEM FOR TEMPORARILY RETIRED MEMORY PORTIONS

(75) Inventors: Hanan Weingarten, Herzelia (IL); Shmuel Levy, Qiryat Tivon (IL); Michael Katz, Haifa (IL)

(73) Assignee: Densbits Technologies Ltd., Haifa (IL)

( * ) Notice: Subject to any disclaimer, the term of this patent is extended or adjusted under 35 U.S.C. 154(b) by 428 days.

(21) Appl. No.: 12/596,446

(22) PCT Filed: Sep. 17, 2008

(86) PCT No.: PCT/IL2008/001230
§ 371 (c)(1),
(2), (4) Date: Oct. 19, 2009

(87) PCT Pub. No.: WO2009/072100
PCT Pub. Date: Jun. 11, 2009

(65) Prior Publication Data
US 2010/0064096 A1 Mar. 11, 2010

Related U.S. Application Data

(60) Provisional application No. 61/006,805, filed on Jan. 31, 2008, provisional application No. 61/071,465, filed on Apr. 30, 2008, provisional application No. 60/996,782, filed on Dec. 5, 2007, provisional application No. 61/064,853, filed on Mar. 31, 2008, provisional application No. 61/129,608, filed on Jul. 8, 2008.

(51) Int. Cl.
*G06F 12/00* (2006.01)
*G06F 13/00* (2006.01)
*G06F 13/28* (2006.01)

(52) U.S. Cl. ... 711/103; 711/154; 711/170; 365/185.33; 714/702

(58) Field of Classification Search .................. 711/103
See application file for complete search history.

(56) References Cited

U.S. PATENT DOCUMENTS

| | | | |
|---|---|---|---|
| 4,463,375 A | 7/1984 | Macovski |
| 4,584,686 A | 4/1986 | Fritze |
| 4,589,084 A | 5/1986 | Fling et al. |
| 4,866,716 A | 9/1989 | Weng |
| 5,077,737 A | 12/1991 | Leger et al. |
| 5,297,153 A | 3/1994 | Baggen et al. |
| 5,657,332 A | 8/1997 | Auclair et al. |
| 5,729,490 A | 3/1998 | Calligaro et al. |
| 5,793,774 A | 8/1998 | Usui et al. |

(Continued)

OTHER PUBLICATIONS

"Exploiting Heat-Accelerated Flash Memory Wear-Out Recovery to Enable Self-Healing SSDs"; Qi Wu, Guiqiang Dong, and Tong Zhang; ECSE Department, Rensselaer Polytechnic Institute (RPI), USA; Jun. 14, 2011.*

(Continued)

*Primary Examiner* — Christian P Chace
*Assistant Examiner* — Prasith Thammavong
(74) *Attorney, Agent, or Firm* — SNR Denton US LLP

(57) ABSTRACT

Flash memory apparatus including a plurality of memory portions, and a controller operative to reserve for data retention purposes, for at least a first duration of time, only certain portions from among said plurality of memory portions including allocating data, during the first duration of time, only to the certain portions, thereby to define at least one of the plurality of memory portions other than the certain portions as a retired memory portion for the first duration of time.

1 Claim, 20 Drawing Sheets

U.S. PATENT DOCUMENTS

| | | |
|---|---|---|
| 5,926,409 A | 7/1999 | Engh et al. |
| 5,956,268 A | 9/1999 | Lee |
| 5,982,659 A | 11/1999 | Irrinki et al. |
| 6,038,634 A | 3/2000 | Ji et al. |
| 6,094,465 A | 7/2000 | Stein et al. |
| 6,119,245 A | 9/2000 | Hiratsuka |
| 6,182,261 B1 | 1/2001 | Haller et al. |
| 6,192,497 B1 | 2/2001 | Yang et al. |
| 6,195,287 B1 | 2/2001 | Hirano |
| 6,199,188 B1 | 3/2001 | Shen et al. |
| 6,209,114 B1 | 3/2001 | Wolf et al. |
| 6,259,627 B1 | 7/2001 | Wong |
| 6,278,633 B1 | 8/2001 | Wong et al. |
| 6,279,133 B1 | 8/2001 | Vafai et al. |
| 6,301,151 B1 | 10/2001 | Engh et al. |
| 6,370,061 B1 | 4/2002 | Yachareni et al. |
| 6,374,383 B1 | 4/2002 | Weng |
| 6,504,891 B1 | 1/2003 | Chevallier |
| 6,532,169 B1 | 3/2003 | Mann et al. |
| 6,532,556 B1 | 3/2003 | Wong et al. |
| 6,553,533 B2 | 4/2003 | Demura et al. |
| 6,560,747 B1 | 5/2003 | Weng |
| 6,637,002 B1 | 10/2003 | Weng et al. |
| 6,639,865 B2 | 10/2003 | Kwon |
| 6,674,665 B1 | 1/2004 | Mann et al. |
| 6,704,902 B1 | 3/2004 | Shinbashi et al. |
| 6,751,766 B2 | 6/2004 | Guterman et al. |
| 6,772,274 B1 | 8/2004 | Estakhri |
| 6,781,910 B2 | 8/2004 | Smith |
| 6,792,569 B2 | 9/2004 | Cox et al. |
| 6,873,543 B2 | 3/2005 | Smith et al. |
| 6,891,768 B2 | 5/2005 | Smith et al. |
| 6,914,809 B2 | 7/2005 | Hilton et al. |
| 6,915,477 B2 | 7/2005 | Gollamudi et al. |
| 6,952,365 B2 | 10/2005 | Gonzalez et al. |
| 6,961,890 B2 | 11/2005 | Smith |
| 6,990,012 B2 | 1/2006 | Smith et al. |
| 6,996,004 B1 | 2/2006 | Fastow et al. |
| 6,999,854 B2 | 2/2006 | Roth |
| 7,010,739 B1 | 3/2006 | Feng et al. |
| 7,012,835 B2 | 3/2006 | Gonzalez et al. |
| 7,038,950 B1 | 5/2006 | Hamilton et al. |
| 7,068,539 B2 | 6/2006 | Guterman et al. |
| 7,079,436 B2 | 7/2006 | Perner et al. |
| 7,149,950 B2 | 12/2006 | Spencer et al. |
| 7,177,977 B2 | 2/2007 | Chen et al. |
| 7,191,379 B2 | 3/2007 | Adelmann et al. |
| 7,196,946 B2 | 3/2007 | Chen et al. |
| 7,203,874 B2 | 4/2007 | Roohparvar |
| 7,254,692 B1* | 8/2007 | Teoh et al. ............ 711/218 |
| 7,290,203 B2 | 10/2007 | Emma et al. |
| 7,292,365 B2 | 11/2007 | Knox |
| 7,301,928 B2 | 11/2007 | Nakabayashi et al. |
| 7,441,067 B2 | 10/2008 | Gorobets et al. |
| 7,466,575 B2 | 12/2008 | Shalvi et al. |
| 7,533,328 B2 | 5/2009 | Alrod et al. |
| 7,558,109 B2 | 7/2009 | Brandman et al. |
| 7,593,263 B2 | 9/2009 | Sokolov et al. |
| 7,697,326 B2 | 4/2010 | Sommer et al. |
| 7,706,182 B2 | 4/2010 | Shalvi et al. |
| 7,804,718 B2 | 9/2010 | Kim |
| 7,805,663 B2 | 9/2010 | Brandman et al. |
| 7,805,664 B1 | 9/2010 | Yang et al. |
| 7,844,877 B2 | 11/2010 | Litsyn et al. |
| 7,961,797 B1 | 6/2011 | Yang et al. |
| 8,020,073 B2 | 9/2011 | Emma et al. |
| 8,122,328 B2 | 2/2012 | Liu et al. |
| 8,248,831 B2* | 8/2012 | Rotbard et al. ............ 365/45 |
| 2002/0063774 A1 | 5/2002 | Hillis et al. |
| 2002/0085419 A1 | 7/2002 | Kwon et al. |
| 2002/0154769 A1 | 10/2002 | Petersen et al. |
| 2003/0065876 A1 | 4/2003 | Lasser |
| 2003/0101404 A1 | 5/2003 | Zhao et al. |
| 2003/0105620 A1 | 6/2003 | Bowen |
| 2003/0192007 A1 | 10/2003 | Miller et al. |
| 2004/0015771 A1 | 1/2004 | Lasser et al. |
| 2004/0030971 A1 | 2/2004 | Tanaka et al. |
| 2004/0080985 A1* | 4/2004 | Chang et al. ............ 365/185.33 |
| 2004/0153722 A1 | 8/2004 | Lee |
| 2004/0153817 A1 | 8/2004 | Norman et al. |
| 2004/0181735 A1 | 9/2004 | Xin |
| 2005/0013165 A1 | 1/2005 | Ban |
| 2005/0018482 A1 | 1/2005 | Cemea et al. |
| 2005/0083735 A1 | 4/2005 | Chen et al. |
| 2005/0117401 A1 | 6/2005 | Chen et al. |
| 2005/0120265 A1 | 6/2005 | Pline et al. |
| 2005/0128811 A1 | 6/2005 | Kato et al. |
| 2005/0138533 A1 | 6/2005 | Le Bars et al. |
| 2005/0144213 A1 | 6/2005 | Simkins et al. |
| 2005/0144368 A1 | 6/2005 | Chung et al. |
| 2005/0169057 A1 | 8/2005 | Shibata et al. |
| 2005/0172179 A1 | 8/2005 | Brandenberger et al. |
| 2005/0213393 A1 | 9/2005 | Lasser |
| 2005/0243626 A1* | 11/2005 | Ronen .......................... 365/222 |
| 2006/0059406 A1 | 3/2006 | Micheloni et al. |
| 2006/0059409 A1 | 3/2006 | Lee |
| 2006/0064537 A1 | 3/2006 | Oshima |
| 2006/0101193 A1 | 5/2006 | Murin |
| 2006/0203587 A1 | 9/2006 | Li et al. |
| 2006/0221692 A1 | 10/2006 | Chen |
| 2006/0248434 A1 | 11/2006 | Radke et al. |
| 2006/0268608 A1 | 11/2006 | Noguchi et al. |
| 2006/0284244 A1* | 12/2006 | Forbes et al. .................. 257/324 |
| 2006/0294312 A1 | 12/2006 | Walmsley |
| 2007/0025157 A1 | 2/2007 | Wan et al. |
| 2007/0063180 A1 | 3/2007 | Asano et al. |
| 2007/0103992 A1 | 5/2007 | Sakui et al. |
| 2007/0104004 A1 | 5/2007 | So et al. |
| 2007/0109858 A1 | 5/2007 | Conley et al. |
| 2007/0124652 A1 | 5/2007 | Litsyn et al. |
| 2007/0143561 A1 | 6/2007 | Gorobets |
| 2007/0150694 A1 | 6/2007 | Chang et al. |
| 2007/0168625 A1 | 7/2007 | Cornwell et al. |
| 2007/0171714 A1 | 7/2007 | Wu et al. |
| 2007/0171730 A1 | 7/2007 | Ramamoorthy et al. |
| 2007/0180346 A1 | 8/2007 | Murin |
| 2007/0223277 A1 | 9/2007 | Tanaka et al. |
| 2007/0226582 A1 | 9/2007 | Tang et al. |
| 2007/0226592 A1 | 9/2007 | Radke |
| 2007/0228449 A1* | 10/2007 | Takano et al. .................. 257/314 |
| 2007/0253249 A1 | 11/2007 | Kang et al. |
| 2007/0253250 A1 | 11/2007 | Shibata et al. |
| 2007/0263439 A1 | 11/2007 | Cornwell et al. |
| 2007/0266291 A1 | 11/2007 | Toda et al. |
| 2007/0271494 A1 | 11/2007 | Gorobets |
| 2008/0010581 A1 | 1/2008 | Alrod et al. |
| 2008/0028014 A1 | 1/2008 | Hilt et al. |
| 2008/0055989 A1 | 3/2008 | Lee et al. |
| 2008/0082897 A1 | 4/2008 | Brandman et al. |
| 2008/0092026 A1 | 4/2008 | Brandman et al. |
| 2008/0104309 A1 | 5/2008 | Cheon et al. |
| 2008/0116509 A1 | 5/2008 | Harari et al. |
| 2008/0126686 A1 | 5/2008 | Sokolov et al. |
| 2008/0127104 A1 | 5/2008 | Li et al. |
| 2008/0128790 A1 | 6/2008 | Jung |
| 2008/0130341 A1 | 6/2008 | Shalvi et al. |
| 2008/0137413 A1 | 6/2008 | Kong et al. |
| 2008/0148115 A1 | 6/2008 | Sokolov et al. |
| 2008/0158958 A1 | 7/2008 | Sokolov et al. |
| 2008/0159059 A1 | 7/2008 | Moyer |
| 2008/0162079 A1 | 7/2008 | Astigarraga et al. |
| 2008/0168216 A1 | 7/2008 | Lee |
| 2008/0168320 A1 | 7/2008 | Cassuto et al. |
| 2008/0181001 A1 | 7/2008 | Shalvi |
| 2008/0198650 A1 | 8/2008 | Shalvi et al. |
| 2008/0198652 A1 | 8/2008 | Shalvi et al. |
| 2008/0219050 A1 | 9/2008 | Shalvi et al. |
| 2008/0225599 A1 | 9/2008 | Chae |
| 2008/0263262 A1 | 10/2008 | Sokolov et al. |
| 2008/0282106 A1 | 11/2008 | Shalvi et al. |
| 2008/0285351 A1 | 11/2008 | Shlick et al. |
| 2008/0301532 A1 | 12/2008 | Uchikawa et al. |
| 2009/0024905 A1 | 1/2009 | Shalvi et al. |
| 2009/0043951 A1 | 2/2009 | Shalvi et al. |
| 2009/0072303 A9 | 3/2009 | Prall et al. |
| 2009/0091979 A1 | 4/2009 | Shalvi |
| 2009/0103358 A1 | 4/2009 | Sommer et al. |

| | | |
|---|---|---|
| 2009/0106485 A1 | 4/2009 | Anholt |
| 2009/0113275 A1 | 4/2009 | Chen et al. |
| 2009/0125671 A1 | 5/2009 | Flynn et al. |
| 2009/0144600 A1 | 6/2009 | Perlmutter et al. |
| 2009/0150748 A1 | 6/2009 | Egner et al. |
| 2009/0157964 A1 | 6/2009 | Kasorla et al. |
| 2009/0158126 A1 | 6/2009 | Perlmutter et al. |
| 2009/0168524 A1 | 7/2009 | Golov et al. |
| 2009/0187803 A1 | 7/2009 | Anholt et al. |
| 2009/0199074 A1 | 8/2009 | Sommer |
| 2009/0213653 A1 | 8/2009 | Perlmutter et al. |
| 2009/0213654 A1 | 8/2009 | Perlmutter et al. |
| 2009/0228761 A1 | 9/2009 | Perlmutter et al. |
| 2009/0240872 A1 | 9/2009 | Perlmutter et al. |
| 2010/0005270 A1 | 1/2010 | Jiang |
| 2010/0025811 A1* | 2/2010 | Bronner et al. ............... 257/528 |
| 2010/0058146 A1 | 3/2010 | Weingarten et al. |
| 2010/0064096 A1 | 3/2010 | Weingarten et al. |
| 2010/0088557 A1 | 4/2010 | Weingarten et al. |
| 2010/0091535 A1 | 4/2010 | Sommer et al. |
| 2010/0095186 A1 | 4/2010 | Weingarten |
| 2010/0110787 A1 | 5/2010 | Shalvi et al. |
| 2010/0115376 A1 | 5/2010 | Shalvi et al. |
| 2010/0122113 A1 | 5/2010 | Weingarten et al. |
| 2010/0124088 A1 | 5/2010 | Shalvi et al. |
| 2010/0131580 A1 | 5/2010 | Kanter et al. |
| 2010/0131806 A1 | 5/2010 | Weingarten et al. |
| 2010/0131809 A1 | 5/2010 | Katz |
| 2010/0131826 A1 | 5/2010 | Shalvi et al. |
| 2010/0131827 A1 | 5/2010 | Sokolov et al. |
| 2010/0131831 A1 | 5/2010 | Weingarten et al. |
| 2010/0146191 A1 | 6/2010 | Katz |
| 2010/0146192 A1 | 6/2010 | Weingarten et al. |
| 2010/0149881 A1 | 6/2010 | Lee et al. |
| 2010/0180073 A1 | 7/2010 | Weingarten et al. |
| 2010/0199149 A1 | 8/2010 | Weingarten et al. |
| 2010/0211724 A1 | 8/2010 | Weingarten |
| 2010/0211833 A1 | 8/2010 | Weingarten |
| 2010/0211856 A1 | 8/2010 | Weingarten |
| 2010/0251066 A1 | 9/2010 | Radke |
| 2010/0253555 A1 | 10/2010 | Weingarten et al. |
| 2010/0257309 A1 | 10/2010 | Barsky et al. |
| 2010/0293321 A1 | 11/2010 | Weingarten |
| 2011/0051521 A1 | 3/2011 | Levy et al. |
| 2011/0055461 A1 | 3/2011 | Steiner et al. |
| 2011/0096612 A1 | 4/2011 | Steiner et al. |
| 2011/0119562 A1 | 5/2011 | Steiner et al. |
| 2011/0153919 A1 | 6/2011 | Sabbag |
| 2011/0161775 A1 | 6/2011 | Weingarten |
| 2011/0214029 A1 | 9/2011 | Steiner et al. |
| 2011/0214039 A1 | 9/2011 | Steiner et al. |
| 2011/0246792 A1 | 10/2011 | Weingarten |
| 2011/0246852 A1 | 10/2011 | Sabbag |
| 2011/0252187 A1 | 10/2011 | Segal et al. |
| 2011/0252188 A1 | 10/2011 | Weingarten |
| 2011/0271043 A1 | 11/2011 | Segal et al. |
| 2011/0302428 A1 | 12/2011 | Weingarten |
| 2012/0001778 A1 | 1/2012 | Steiner et al. |
| 2012/0005554 A1 | 1/2012 | Steiner et al. |
| 2012/0005558 A1 | 1/2012 | Steiner et al. |
| 2012/0005560 A1 | 1/2012 | Steiner et al. |
| 2012/0008401 A1 | 1/2012 | Katz et al. |
| 2012/0008414 A1 | 1/2012 | Katz et al. |
| 2012/0051144 A1 | 3/2012 | Weingarten et al. |
| 2012/0063227 A1 | 3/2012 | Weingarten et al. |
| 2012/0066441 A1 | 3/2012 | Weingarten |
| 2012/0110250 A1 | 5/2012 | Sabbag et al. |

OTHER PUBLICATIONS

"A First Study on Self-Healing Solid-State Drives"; Qi Wu, Guiqiang Dong and Tong Zhang; ECSE Department, Rensselaer Polytechnic Institute (RPI), USA; May 25, 2011.*
International Search Report and Written Opinion for Application No. PCT/IL2008/001230, dated Jan. 28, 2009.
Search Report of PCT Patent Application WO 2009/118720 A3.
Search Report of PCT Patent Application WO 2009/095902 A3.
Search Report of PCT Patent Application WO 2009/078006 A3.
Search Report of PCT Patent Application WO 2009/074979 A3.
Search Report of PCT Patent Application WO 2009/074978 A3.
Search Report of PCT Patent Application WO 2009/072105 A3.
Search Report of PCT Patent Application WO 2009/072104 A3.
Search Report of PCT Patent Application WO 2009/072103 A3.
Search Report of PCT Patent Application WO 2009/072102 A3.
Search Report of PCT Patent Application WO 2009/072101 A3.
Search Report of PCT Patent Application WO 2009/072100 A3.
Search Report of PCT Patent Application WO 2009/053963 A3.
Search Report of PCT Patent Application WO 2009/053962 A3.
Search Report of PCT Patent Application WO 2009/053961 A3.
Search Report of PCT Patent Application WO 2009/037697 A3.
Yani Chen, Kcshab K. Parhi, "Small Area Parallel Chien Search Architectures for Long BCH Codes", Ieee Transactions on Very Large Scale Integration(VLSI) Systems, vol. 12, No. 5, May 2004.
Yuejian Wu, "Low Power Decoding of BCH Codes", Nortel Networks, Ottawa, Ont., Canada, in Circuits and systems, 2004. ISCAS '04. Proceeding of the 2004 International Symposium on Circuits and Systems, published May 23-26, 2004, vol. 2, pp. II-369-II-372 vol. 2.
Michael Purser, "Introduction to Error Correcting Codes", Artech House Inc., 1995.
Ron M. Roth, "Introduction to Coding Theory", Cambridge University Press, 2006.
Akash Kumar, Sergei Sawitzki, "High-Throughput and Low Power Architectures for Reed Solomon Decoder", (a.kumar at tue.nl, Eindhoven University of Technology and sergei.sawitzki at philips.com).
Todd K.Moon, "Error Correction Coding Mathematical Methods and Algorithms", A John Wiley & Sons, Inc., 2005.
Richard E. Blahut, "Algebraic Codes for Data Transmission", Cambridge University Press, 2003.
David Esseni, Bruno Ricco, "Trading-Off Programming Speed and Current Absorption in Flash Memories with the Ramped-Gate Programming Technique", Ieee Transactions on Electron Devices, vol. 47, No. 4, Apr. 2000.
Giovanni Campardo, Rino Micheloni, David Novosel, "VLSI-Design of Non-Volatile Memories", Springer Berlin Heidelberg New York, 2005.
John G. Proakis, "Digital Communications", 3rd ed., New York: McGraw-Hill, 1995.
J.M. Portal, H. Aziza, D. Nee, "EEPROM Memory: Threshold Voltage Built in Self Diagnosis", ITC International Test Conference, Paper 2.1.
J.M. Portal, H. Aziza, D. Nee, "EEPROM Diagnosis Based on Threshold Voltage Embedded Measurement", Journal of Electronic Testing: Theory and Applications 21, 33-42, 2005.
G. Tao, A. Scarpa, J. Dijkstra, W. Stidl, F. Kuper, "Data retention prediction for modern floating gate non-volatile memories", Microelectronics Reliability 40 (2000), 1561-1566.
T. Hirncno, N. Matsukawa, H. Hazama, K. Sakui, M. Oshikiri, K. Masuda, K. Kanda, Y. Itoh, J. Miyamoto, "A New Technique for Measuring Threshold Voltage Distribution in Flash EEPROM Devices", Proc. IEEE 1995 Int. Conference on Microelectronics Test Structures, vol. 8, Mar. 1995.
Boaz Eitan, Guy Cohen, Assaf Shappir, Eli Lusky, Amichai Givant, Meir Janai, Ilan Bloom, Yan Polansky, Oleg Dadashev, Avi Lavan, Ran Sahar, Eduardo Maayan, "4-bit per Cell NROM Reliability", Appears on the website of Saifun.com.
Paulo Cappelletti, Clara Golla, Piero Olivo, Enrico Zanoni, "Flash Memories", Kluwer Academic Publishers, 1999.
JEDEC Standard, "Stress-Test-Driven Qualification of Integrated Circuits", JEDEC Solid State Technology Association. JEDEC Standard No. 47F pp. 1-26.
Dempster, et al., "Maximum Likelihood from Incomplete Data via the EM Algorithm", Journal of the Royal Statistical Society. Series B (Methodological), vol. 39, No. 1 (1997), pp. 1-38.
Mielke, et al., "Flash EEPROM Threshold Instabilities due to Charge Trapping During Program/Erase Cycling", IEEE Transactions on Device and Materials Reliability, vol. 4, No. 3, Sep. 2004, pp. 335-344.
Daneshbeh, "Bit Serial Systolic Architectures for Multiplicative Inversion and Division over GF (2)", A thesis presented to the University of Waterloo, Ontario, Canada, 2005, pp. 1-118.
Chen, Formulas for the solutions of Quadratic Equations over GF (2), IEEE Trans. Inform. Theory, vol. IT-28, No. 5, Sep. 1982, pp. 792-794.
Berlekamp et al., "On the Solution of Algebraic Equations over Finite Fields", Inform. Cont. 10, Oct. 1967, pp. 553-564.

* cited by examiner

| EB Logical address | EB Physical address | Cycle Count | Time Stamp |
|---|---|---|---|
| 0 | 6 | 1003 | 1 Hour ago |
| 1 | 7 | 1003 | 1.5 Hour ago |
| 2 | 1 | 1006 | 2 Hours ago |
| : | : | : | : |
| : | : | : | : |
| Last logical address | 30 | 1027 | - |
| Retired1 | 27 | 1030 | 3 hours ago |
| Retired2 | 28 | 1030 | 3 hours ago |
| : | : | : | : |
| Retired4 | 31 | 1030 | 19 hours ago |

Figure 5B

| EB Logical address | EB Physical address | Cycle Count | Time Stamp |
|---|---|---|---|
| 0 | 6 | 1003 | - |
| 1 | 7 | 1003 | - |
| 2 | 1 | 1006 | - |
| : | : | : | : |
| : | : | : | : |
| Last logical address | 30 | 1027 | - |
| Retired | 27 | 1030 | 3 hours ago |
| Retired | 28 | 1030 | 3 hours ago |
| : | : | : | : |
| Retired | 31 | 1030 | 19 hours ago |

Figure 5C

| EB Logical address | EB Physical address | Cycle Count | Time Stamp |
|---|---|---|---|
| 0 | 6 | 1003 | - |
| 1 | 7 | 1003 | - |
| 2 | 1 | 1006 | - |
| ⋮ | ⋮ | ⋮ | ⋮ |
| ⋮ | ⋮ | ⋮ | ⋮ |
| Last logical address | 30 | 1029 | - |
| Retired1 | 27 | 1030 | 4 hours ago |
| Retired2 | 28 | 1030 | 4 hours ago |
| ⋮ | ⋮ | ⋮ | ⋮ |
| Retired4 | 31 | 1030 | 20 hours ago |

Figure 5D

| EB Logical address | EB Physical address | Cycle Count | Time Stamp |
|---|---|---|---|
| 0 | 6 | 1003 | - |
| 1 | 7 | 1003 | - |
| 2 | 1 | 1006 | - |
| : | : | : | : |
| : | : | : | : |
| Retired1 | 30 | 1030 | 1 Minute ago |
| Retired2 | 27 | 1030 | 5 hours ago |
| Retired4 | 28 | 1030 | 5 hours ago |
| : | : | : | : |
| Last logical address | 31 | 1000 | - |

Figure 5E

| EB Logical address | EB Physical address |
|---|---|
| 0 | 6 |
| 1 | 7 |
| 2 | 1 |
| ⋮ | ⋮ |
| ⋮ | ⋮ |
| Last logical address | 30 |
| Retired | 27 |
| Retired | 28 |
| ⋮ | ⋮ |
| Retired | 31 |

Figure 9

FLASH MEMORY APPARATUS WITH A HEATING SYSTEM FOR TEMPORARILY RETIRED MEMORY PORTIONS

CROSS-REFERENCE TO CO PENDING RELATED APPLICATIONS

This application is a National Phase Application of PCT International Application No. PCT/IL2008/001230, entitled "SYSTEM AND METHODS FOR TEMPORARILY RETIRING MEMORY PORTIONS" International Filing Date Sep. 17, 2008, published on Jun. 11, 2009 as International Publication No. WO 2009/072100 which in turn claims priority from U.S. Provisional Application No. 61/006,805, filed Jan. 31, 2008, U.S. Provisional Application No. 61/071, 465, filed Apr. 30, 2008, U.S. Provisional Application No. 60/996,782, filed Dec. 5, 2007, U.S. Provisional Application No. 61/064,853, filed Mar. 31, 2008, U.S. Provisional Application No. 61/129,608, filed Jul. 8, 2008, all of which are incorporated herein by reference in their entirety Other applications include: U.S. Provisional Application No. 60/960,207, filed Sep. 20, 2007 and entitled "Systems' and Methods for Coupling Detection in Flash Memory", U.S. Provisional Application No. 61/071,467, filed Apr. 30, 2008 and entitled "Improved Systems and Methods for Determining Logical Values of Coupled Flash Memory Cells", U.S. Provisional Application No. 60/960,943, filed Oct. 22, 2007 and entitled "Systems and methods to reduce errors in Solid State Disks and Large Flash Devices" and U.S. Provisional Application No. 61/071,469, filed Apr. 30, 2008 and entitled "Systems and Methods for Averaging Error Rates in Non-Volatile Devices and Storage Systems", U.S. Provisional Application No. 60/996,027, filed Oct. 25, 2007 and entitled "Systems and Methods for Coping with Variable Bit Error Rates in Flash Devices", U.S. Provisional Application No. 61/071,466, filed Apr. 30, 2008 and entitled "Systems and Methods for Multiple Coding Rates in Flash Devices", U.S. Provisional Application No. 61/006,120, filed Dec. 19, 2007 and entitled "Systems and Methods for Coping with Multi Stage Decoding in Flash Devices", U.S. Provisional Application No. 61/071,464, filed Apr. 30, 2008 and entitled "A Decoder Operative to Effect A Plurality of Decoding Stages Upon Flash Memory Data and Methods Useful in Conjunction Therewith", U.S. Provisional Application No. 61/006, 385, filed Jan. 10, 2008 and entitled "A System for Error Correction Encoder and Decoder Using the Lee Metric and Adapted to Work on Multi-Level Physical Media", U.S. Provisional Application No. 61/064,995, filed Apr. 8, 2008 and entitled "Systems and Methods for Error Correction and Decoding on Multi-Level Physical Media", U.S. Provisional Application No. 60/996,948, filed Dec. 12, 2007 and entitled "Low Power BCH/RS Decoding: a Low Power Chien-Search Implementation", U.S. Provisional Application No. 61/071, 487, filed May 1, 2008 and entitled "Chien-Search System Employing a Clock-Gating Scheme to Save Power for Error Correction Decoder and other Applications", U.S. Provisional Application No. 61/071,468, filed Apr. 30, 2008 and entitled "A Low Power Chien-Search Based BCH/RS Recoding System for Flash Memory, Mobile Communications Devices and Other Applications", U.S. Provisional Application No. 61/006,806, filed Jan. 31, 2008 and entitled "Systems and Methods for using a Erasure Coding in Flash memory", U.S. Provisional Application No. 61/071,486, filed May 1, 2008 and entitled "Systems and Methods for Handling Immediate Data Errors in Flash Memory", U.S. Provisional Application No. 61/006,078, filed Dec. 18, 2007 and entitled "Systems and Methods for Multi Rate Coding in Multi Level Flash Devices", U.S. Provisional Application No. 61/064,923, filed Apr. 30, 2008 and entitled "Apparatus For Coding At A Plurality Of Rates In Multi-Level Flash Memory Systems, And Methods Useful In Conjunction Therewith", U.S. Provisional Application No. 61/064,760, filed Mar. 25, 2008 and entitled "Hardware efficient implementation of rounding in fixed-point arithmetic", U.S. Provisional Application No. 61/071, 404, filed Apr. 28, 2008 and entitled "Apparatus and Methods for Hardware-Efficient Unbiased Rounding", U.S. Provisional Application No. 61/136,234, filed Aug. 20, 2008 and entitled "A Method Of Reprogramming A Non-Volatile Memory Device Without Performing An Erase Operation", U.S. Provisional Application No. 61/129,414, filed Jun. 25, 2008 and entitled "Improved Programming Speed in Flash Devices Using Adaptive Programming", and several other co-pending patent applications being filed concurrently (same day).

FIELD OF THE INVENTION

The present invention relates generally to memory devices and more particularly to flash memory devices.

BACKGROUND OF THE INVENTION

Relevant prior art includes:

[1] N. Mielke, H. Belgal, I. Kalastrisky, P. Kalavade, A. Kurtz, Q. Meng, N. Righos, and J. Wu, "Flash EEPROM Threshold Instabilities due to Charge Trapping During Program/Erase Cycling", IEEE Trans. On Device and Materials Reliability, Vol. 4, No. 3, September 2004

[2] J.-D. Lee, J.-H. Choi, D. Park and K. Kim "Degradation of tunnel oxide by FN current stress and its effects on data retention characteristics of 90 nm," Proc. IRPS, is 2003, p. 497.

[3] G. Wong, "The Next Killer Technologies?: 3-bit and 4-bit per cell NAND Flash Memories", Web-Feet Research, Inc. Report: MTS340 MB-28, December 2007

[4] E. Gal. and S. Toled, "A Transactional File System for Microcontrollers", 2005 USENIX Annual Technical Conference, p. 89-104

[5] YAFFS, available on the World Wide Web at yaffs.net/yaffs-documentation.

[6] U.S. Pat. Nos. 7,301,818, 7,325,090; published US Application 2007211534, and Published PCT application WO2007132452,

[7] an Intel Corporation presentation entitled "Reliability of floating-gate flash memories", by Neal Mielke, presented by Hanmant Belgal and available on Internet on 23 Mar. 2008.

Notations such as [1], [2], [3], [4], [5] are used in the specification to indicate reference to the above documents.

The disclosures of all publications and patent documents mentioned in the specification, and of the publications and patent documents cited therein directly or indirectly, are hereby incorporated by reference.

SUMMARY OF THE INVENTION

Certain embodiments of the present invention seek to provide improved flash memory, in which some memory portions are temporarily retired.

There is thus provided, in accordance with at least one embodiment of the present invention, flash memory apparatus including a plurality of memory portions, and a controller operative to reserve for data retention purposes, for at least a first duration of time, only certain portions from among the plurality of memory portions including allocating data, during the first duration of time, only to the certain portions, an thereby to define at least one of the plurality of memory portions other than the certain portions as a retired memory portion for the first duration of time.

Further in accordance with at least one embodiment of the present invention, the controller is operative to program incoming data, for the first duration of time, only into the certain portions.

Still further in accordance with at least one embodiment of the present invention, the controller is operative to read data, for the first duration of time, only from the certain portions.

Additionally in accordance with at least one embodiment of the present invention, the controller is operative to obviate any need to read data from the retired memory portion by reproducing data residing in the retired memory portion in at least one of the certain portions.

Further in accordance with at least one embodiment of the present invention, the controller is operative at least once to define the at least one retired memory portion as an active memory portion in which data can be stored, by including the retired memory portion in the certain portions after the first duration of time has elapsed so as to reserve for data retention purposes, for at least a second duration of time subsequent to the first duration of time, only the certain portions, thereby to benefit from enhanced data retention performance of the retired memory portion due to retirement thereof during the first duration.

Still further in accordance with at least one embodiment of the present invention, the controller is operative at least once within the first duration of time to define at least an individual one of the certain memory portions as a retired portion.

Additionally in accordance with at least one embodiment of the present invention, the controller serves a data-employing application and wherein at least the individual one of the memory portions defined as a retired portion comprises a memory portion from among the certain memory portions which contains data no longer needed by the data-employing application.

Further in accordance with at least one embodiment of the present invention, the controller is operative to reproduce data from at least the individual memory portion defined as a retired portion, in an additional memory portion from among the plurality of memory portions.

Still further in accordance with at least one embodiment of the present invention, the additional memory portion comprises a formerly retired portion which is re-defined by the controller after the first duration as a newly active portion by reserving the formerly retired portion for data retention purposes after the first duration, while defining the newly active memory portion as a retired portion which is not reserved for data retention purposes after the first duration.

Additionally in accordance with at least one embodiment of the present invention, the controller is operative to define at least the individual one of the certain memory portions as a retired portion, subsequent to receipt of an erase command pertaining to the at least one individual memory portion.

Further in accordance with at least one embodiment of the present invention, at least one the retired memory portions defined as an active portion was, before becoming a retired memory portion for time period T, defined as one of the certain memory portions and wherein the controller is operative to erase the memory portion defined as one of the certain memory portions, then as a retired memory portion, then again as an active memory portion, within the time period T.

Still further in accordance with at least one embodiment of the present invention, a population of traps develops in the memory portions responsive to cycling thereof and subsides between cycles as a function of time between the cycles, and wherein the first duration of time for which at least one individual memory portion is retired is selected to statistically contain increase in the population of traps in the individual memory portion.

Additionally in accordance with at least one embodiment of the present invention, the first duration of time for which at least one individual memory portion is retired is selected to statistically prevent increase in the population of traps in the individual memory portion.

Further in accordance with at least one embodiment of the present invention, the apparatus also comprises a heating system for heating at least one retired memory portion.

Still further in accordance with at least one embodiment of the present invention, a population of traps develops in the memory portions responsive to cycling thereof and subsides between cycles as a function of time between the cycles and the apparatus also comprises an effective cycle counter for at least an individual memory portion from among the certain memory portions, operative to store an effective number of cycles which the individual memory portion has undergone, wherein the effective number is an increasing function of an actual number of cycles that the individual memory portion has undergone, and a decreasing function of a length of at least one time period extending between cycles that the individual memory portion has undergone.

Further in accordance with at least one embodiment of the present invention, the controller, at intervals, re-defines at least one memory portion having one status from among an active status and a retired status, to another status from among the active status and the retired status, and wherein the intervals are periodical.

Still further in accordance with at least one embodiment of the present invention, the controller, at intervals, re-defines at least one memory portion having one status from among an active status and a retired status, to another status from among the active status and the retired status, and wherein the intervals are triggered by occurrence of a flash memory event.

Additionally in accordance with at least one embodiment of the present invention, the flash memory event comprises issuance of an erase command to at least one of the plurality of memory portions.

Further in accordance with at least one embodiment of the present invention, the controller, at intervals, re-defines at least one retired memory portion as an active memory portion reserved for data retention purposes, and wherein a redundant code characterized by a proportion of redundancy is used to encode the plurality of memory portions and wherein the proportion of redundancy is selected to take into account a reduced probability of error in the retired memory portion redefined as an active memory portion.

Still further in accordance with at least one embodiment of the present invention, the plurality of memory portions comprise NROM flash memory portions.

Further in accordance with at least one embodiment of the present invention, the plurality of memory portions comprises at least two flash memory devices and wherein the heating system comprises at least one heater configured and arranged to selectably heat only a subset of the at least two flash memory devices and wherein the controller selectably defines all memory portions included in the subset as retired memory portions.

Still further in accordance with at least one embodiment of the present invention, the plurality of memory portions comprises a number of sets of NAND flash memory cells strung together into a corresponding number of strings of cells and wherein the heating system comprises apparatus for selectably heating a selected one of the strings of cells.

Also provided, in accordance with at least one embodiment of the present invention, is a method for operating a flash memory device comprising a multiplicity of flash memory cells, the method comprising programming selected ones from among the multiplicity of cells and, for at least one individual cell of the multiplicity of cells, tracking the amount of time since programming last occurred in the individual cell.

Also provided, in accordance with at least one embodiment of the present invention, is a memory device comprising an array of semiconductor cells undergoing cycling causing deterioration of the cells; and at least one heating element operative to heat at least one cell of the array of semiconductor cells thereby reducing the cell's deterioration due to the cycling.

Further in accordance with at least one embodiment of the present invention, the controller is operative, for each retired memory portion comprising a multiplicity of cells each able to store several selectable values, to program at least some of the multiplicity of cells to a highest value from among the several selectable values as the first duration of time begins.

Further provided, in accordance with at least one embodiment of the present invention, is a method for using Flash memory apparatus, the method including reserving for data retention purposes, for at least a first duration of time, only certain portions from among the plurality of memory portions including allocating data, during the first duration of time, only to the certain portions, thereby to define at least one of the plurality of memory portions other than the certain portions as a retired memory portion for the first duration of time.

Additionally in accordance with at least one embodiment of the present invention, the method further comprises reserving for data retention purposes, for at least a first duration of time, the first duration being compared against the amount of time, to the at least one individual cell from among the multiplicity of cells including allocating data, during the first duration of time, only to the at least one individual cell, thereby to define at least one of the multiplicity of cells other than the at least one individual cell as a retired cell for the first duration of time.

The following terms may be construed either in accordance with any definition thereof appearing in the prior art literature or in accordance with the specification, or as follows:

Bit error rate (BER)=a parameter that a flash memory device manufacturer commits to vis a vis its customers, expressing the maximum proportion of wrongly read bits (wrongly read bits/total number of bits) that users of the flash memory device need to expect at any time during the stipulated lifetime of the flash memory device e.g. 10 years.

Block=a set of flash memory device cells which must, due to physical limitations of the flash memory device, be erased together. Also termed erase sector, erase block.

Cell: A component of flash memory that stores one bit of information (in single-level cell devices) or n bits of information (in a multi-level device having 2 exp n levels). Typically, each cell comprises a floating-gate transistor. n may or may not be an integer. "Multi-level" means that the physical levels in the cell are, to an acceptable level of certainty, statistically partitionable into multiple distinguishable regions, plus a region corresponding to zero, such that digital values each comprising multiple bits can be represented by the cell. In contrast, in single-level cells, the physical levels in the cell are assumed to be statistically partitionable into only two regions, one corresponding to zero and one other, non-zero region, such that only one bit can be represented by a single-level cell.

Charge level: the measured voltage of a cell which reflects its electric charge.

Cycling: Repeatedly writing new data into flash memory cells and repeatedly erasing the cells between each two writing operations.

Decision regions: Regions extending between adjacent decision levels, e.g. if decision levels are 0, 2 and 4 volts respectively, the decision regions are under 0 V, 0 V-2 V, 2V-4 V, and over 4 V.

Demapping: basic cell-level reading function in which a digital n-tuple originally received from an outside application is derived from a physical value representing a physical state in the cell having a predetermined correspondence to the digital n-tuple.

Digital value or "logical value": n-tuple of bits represented by a cell in flash memory capable of generating 2 exp n distinguishable levels of a typically continuous physical value such as charge, where n may or may not be an integer.

Erase cycle: The relatively slow process of erasing a block of cells (erase sector), each block typically comprising more than one page, or, in certain non-flash memory devices, of erasing a single cell or the duration of so doing. An advantage of erasing cells collectively in blocks as in flash memory, rather than individually, is enhanced programming speed: Many cells and typically even many pages of cells are erased in a single erase cycle.

Erase-write cycle: The process of erasing a block of cells (erase sector), each block typically comprising a plurality of pages, and subsequently writing new data into at least some of them. The terms "program" and "write" are used herein generally interchangeably.

Flash memory: Non-volatile computer memory including cells that are erased block by block, each block typically comprising more than one page, but are written into and read from, page by page. Includes NOR-type flash memory, NAND-type flash memory, and PRAM, e.g. Samsung PRAM, inter alia, and flash memory devices with any suitable number of levels per cell, such as but not limited to 2, 4, or (as in the embodiment illustrated herein) 8.

Logical page: a portion of typically sequential data, whose amount is typically less than or equal to a predetermined amount of data defined to be a pagefull of data, which has typically been defined by a host (data source/destination) or user thereof, as a page, and which is sent by the host to a flash memory device for storage and is subsequently read by the host from the flash memory device.

Mapping: basic cell-level writing function in which incoming digital n-tuple is mapped to a program level by inducing a program level in the cell, having a predetermined correspondence to the incoming logical value.

Page=A portion, typically 512 or 2048 or 4096 bytes in size, of a flash memory e.g. a NAND or NOR flash memory device. Writing can be performed page by page, as opposed to erasing which can be performed only erase sector by erase sector. A few bytes, typically 16-32 for every 512 data bytes are associated with each page (typically 16, 64 or 128 per page), for storage of error correction information. A typical block may include 32 512-byte pages or 64 2048-byte pages.

Physical page: an ordered set (e.g. sequence or array) of flash memory cells which are all written in simultaneously by each write operation, the set typically comprising a predetermined number of typically physically adjacent flash memory cells containing actual data written by and subsequently read by the host, as well as, typically error correction information and back pointers used for recognizing the true address of a page.

Precise read, soft read: Cell threshold voltages are read at a precision (number of bits) greater than the number of Mapping levels (2^n). The terms precise read or soft read are interchangeable. In contrast, in "hard read", cell threshold voltages are read at a precision (number of bits) smaller than the number of Mapping levels (2^n where n=number of bits per cell).

Present level, Charge level: The amount of charge in the cell. The amount of charge currently existing in a cell, at the present time, as opposed to "program level", the amount of charge originally induced in the cell (i.e. at the end of programming).

Program: same as "write".

Program level (programmed level, programming level): amount of charge originally induced in a cell to represent a given logical value, as opposed to "present level".

Reliability: Reliability of a flash memory device may be operationalized as the probability that a worst-case logical page written and stored in that device for a predetermined long time period such as 10 years will be successfully read i.e. that sufficiently few errors, if any, will be present in the physical page/s storing each logical page such that the error code appended to the logical page will suffice to overcome those few errors.

Reprogrammability (Np): An aspect of flash memory quality. This is typically operationalized by a reprogrammability parameter, also termed herein "Np", denoting the number of times that a flash memory can be re-programmed (number of erase-write cycles that the device can withstand) before the level of errors is so high as to make an unacceptably high proportion of those errors irrecoverable given a predetermined amount of memory devoted to redundancy. Typically recoverability is investigated following a conventional aging simulation process which simulates or approximates the data degradation effect that a predetermined time period e.g. a 10 year period has on the flash memory device, in an attempt to accommodate for a period of up to 10 years between writing of data in flash memory and reading of the data therefrom.

Resolution: Number of levels in each cell, which in turn determines the number of bits the cell can store; typically a cell with 2^n levels stores n bits. Low resolution (partitioning the window, W, of physical values a cell can assume into a small rather than large number of levels per cell) provides high reliability.

Retention: of original physical levels induced in the cells; retention is typically, below 100% resulting in deterioration of original physical levels into present levels.

Retention time: The amount of time that data has been stored in a flash device, typically without, or substantially without, voltage having been supplied to the flash device i.e. the time which elapses between programming of a page and reading of the same page.

Symbol: Logical value

Threshold level: the voltage (e.g.) against which the charge level of a cell is measured. For example, a cell may be said to store a particular digital n-tuple D if the charge level or other physical level of the cell falls between two threshold values T.

Cycle count=cycles=the number of times an erase block has been programmed and erased Time stamp=time at which a particular erase block went into retirement Tr=time period which a particular erase block spends in retirement Alpha=trap dissipation rate; depends on flash technology and typically increases as a function of temperature Alpha_hot=the trap dissipation rate when a particular flash memory device is hot Cs=cycling working point=maximal number of cycles that an erase block can undergo and still perform well; the erase block is therefore retired when Cs is reached or soon afterwards Cdelta=the maximal number of cycles, counting from when its Cs was reached, that an erase block is allowed to undergo before it is retired $$C_{s+delta} = Cs + Cdelta$$

$$C_s + C_d \cdot T_r \cdot \left(\frac{1}{r} - 1\right) = \text{cycling just prior to retirement}$$

Cd=sum of the number of program/erase cycles undergone by each of the active (non-retired) erase blocks in a flash memory device, on an average day. An application-specific parameter.

Effective cycle count=a parameter characterizing a memory portion such as an erase block which is typically an increasing function of the number of erase-write cycles that memory portion has undergone, and an increasing function of the effective duration of time the memory portion had available to recover from erase-write cycles it has undergone, where the effective duration of time is a function of the length of the time period the memory portion had available to recover from erase-write cycles it has undergone and the temperature of the memory portion during that time period.

retirement rate=small r=proportion of erase blocks which are allocated for retirement at any given time. Typically although not always, the retirement rate is fixed.

Trap balance function f=the expected or average or actual number of traps present in a portion of flash memory, following a period of time in which cycling and/or retention and/or retirement may have occurred, relative to (divided by) the expected or average or actual number of traps prior to the same period. If f=1, this indicates that a steady state has been achieved for the trapping process i.e. that the net effect of the cycling and/or retention and/or retirement that occurred during the time period is neutral (no increase, no decrease). If f is more than 1, the number of traps statistically increased over the time period in question. If f is less than 1, the number of traps statistically decreased. Desirable values for the trap balance function are 1 or less than 1.

Tcool=time during which a heated retired erase block is allowed to cool before it is re-defined as an active (non-retired) erase block $\sigma^2$=distribution variance=the variance of distribution of a population of actual physical values invoked in a corresponding population of flash memory cells storing an individual programmed value, either initially or after the flash memory cells have In undergone a given number of cycles and a given period of retention. This variance causes noise, necessitating redundancy R of the code used to encode the programmed values.

Redundancy=capital R=redundancy of a code i.e. the proportion of a page devoted to data cells rather than redundancy cells, which redundant cells are used to properly decode encoded data despite errors therein. R=no. of data bytes per page/total no. of bytes per page Tr=period of retention of a particular erase block RetiredNum=the number of erase blocks which are retired at any given time=r×total number of erase blocks in a flash memory device WearLimit=A wear limiting parameter intended to allow statistical wear leveling of the blocks which are not retired.

RetireLimit=the maximum number of erase operations which an erase block is allowed to undergo before it is retired.
RetireLimit=Cs+Cdelta
F=maximal number of errors that a page can have, if it is to be recoverable, i.e. the number of bits per page that a particular error correction code is capable of correcting
Number n=number of bits per page, including data and redundancy
Pblock=Ppage=probability of irrecoverable page=probability that the number of errors on a particular page exceeds the number of errors that the error correction code used to encode the page, is able to overcome
P=bit error probability=bit error rate
W=window=difference between the highest and lowest programmed values
L=number of programmed values that each cell is able to represent (1 for a single level cell (SLC), more than 1 for a multi-level cell (MLC)
Bank=Several Flash memory chips typically connected to the same controller and operated together to obtain a larger total amount of storage space.

According to certain embodiments of the present invention, a suitable time period between retirements is employed, e.g. as per formula I herein.

According to certain embodiments of the present invention, a suitable retirement rate r is employed, e.g. as per formulae I and/or II herein (or as per formula IV if retirement takes place at an elevated temperature).

According to certain embodiments of the present invention, a suitable cycling working point is employed, e.g. as per formula I herein (or as per formula IV if retirement takes place at an elevated temperature).

According to certain embodiments of the present invention, a suitable time period between retirements is employed, e.g. as per formula I herein (or as per formula IV if retirement takes place at an elevated temperature).

According to certain embodiments of the present invention, a suitable maximal cycle count is employed to trigger retirement, e.g. as per formula III herein.

According to certain embodiments of the present invention, a suitable balance is found between redundancy considerations and retirement considerations e.g. as per any of formulae V-XI herein.

According to certain embodiments of the present invention, a suitable balance is found between code redundancy and retirement rate e.g. as per formula V herein.

According to certain embodiments of the present invention, a suitable variance for code redundancy is employed, e.g. as per formula VI herein.

According to certain embodiments of the present invention, a suitable temporal distribution STD is employed, e.g. as per formula VII herein.

According to certain embodiments of the present invention, redundancy is determined at least partly on the basis of the frame error rate (FER), e.g. as per formula VIII herein.

According to certain embodiments of the present invention, variance is determined at least partly on the basis of cycles, e.g. as per formula IX herein.

According to certain embodiments of the present invention, a suitable bit error rate is determined at least partly as a function of variance, e.g. as per formula X herein.

According to certain embodiments of the present invention, a suitable coding rate is employed, e.g. as per formula XI herein.

Any suitable processor, display and input means may be used to process, is display, store and accept information, including computer programs, in accordance with some or all of the teachings of the present invention, such as but not limited to a conventional personal computer processor, workstation or other programmable device or computer or electronic computing device, either general-purpose or specifically constructed, for processing; a display screen and/or printer and/or speaker for displaying; machine-readable memory such as optical disks, CDROMs, magnetic-optical discs or other discs; RAMs, ROMs, EPROMs, EEPROMs, magnetic or optical or other cards, for storing, and keyboard or mouse for accepting. The term "process" as used above is intended to include any type of computation or manipulation or transformation of data represented as physical, e.g. electronic, phenomena which may occur or reside e.g. within registers and/or memories of a computer.

The above devices may communicate via any conventional wired or wireless digital communication means, e.g. via a wired or cellular telephone network or a computer network such as the Internet.

The apparatus of the present invention may include, according to certain embodiments, machine readable memory containing or otherwise storing a program of instructions which, when executed by the machine, implements some or all of the apparatus, methods, features and functionalities of the invention shown and described herein. Alternatively or in addition, the apparatus of the present invention may include, according to certain embodiments of the invention, a program as above which may be written in any conventional programming language, and optionally a machine for executing the program such as but not limited to a general purpose computer which may optionally be configured or activated in accordance with the teachings of the present invention.

Any trademark occurring in the text or drawings is the property of its owner and occurs herein merely to explain or illustrate one example of how an embodiment of the invention may be implemented.

Unless specifically stated otherwise, as apparent from the following discussions, it is appreciated that throughout the specification discussions, utilizing terms such as, "processing", "computing", "estimating", "selecting", "ranking", "grading", "calculating", "determining", "generating", "reassessing", "classifying", "generating", "producing", "stereo-matching", "registering", "detecting", "associating", "superimposing", "obtaining" or the like, refer to the action and/or processes of a computer or computing system, or processor or similar electronic computing device, that manipulate and/or transform data represented as physical, such as electronic, quantities within the computing system's registers and/or memories, into other data similarly represented as physical quantities within the computing system's memories, registers or other such information storage, transmission or display devices.

BRIEF DESCRIPTION OF THE DRAWINGS

Certain embodiments of the present invention are illustrated in the following drawings:

FIGS. 5B-5C, 5D and 5E show 3 sequential states, respectively, of an example of an erase block mapping table used by the erase block mapping method of FIG. 5A in accordance with certain embodiments of the present invention, which table may or may not store time stamps for active erase blocks as is evident from a comparison of FIGS. 5B and 5C;

FIG. 9 is a table which may be generated e.g. by steps 640, 740 and 840 of the methods of FIGS. 10-12 respectively, may be stored e.g. in the controller 62 of FIG. 3A, and is operative to map logical blocks to physical blocks which is useful, in accordance with certain embodiments of the present invention, in applications in which no cycle count is stored for each memory portion and no clock is provided to record times at which various memory portions are erased. The table of FIG. 9 may be accessed and/or modified by steps 700, 720, 800, 810 inter alia;

DETAILED DESCRIPTION OF CERTAIN
EMBODIMENTS OF THE INVENTION

Today's Flash memory devices store information as charge in "cells", each typically comprising either a floating gate transistor or an NROM transistor. In single-level cell (SLC) devices, each cell stores only one bit of information. Multi-level cell (MLC) devices, can store more than one bit per cell by choosing between multiple levels of electrical charge to apply to the floating gates of their cells. The amount of charge (also known as charge level) is then measured by a detector, by comparing the voltage of the transistor gate (also known as charge level and denoted $V_T$) to a decision threshold voltage (also known as charge level boundary point and denoted $V_D$). The amount of charge is then used to determine the programmed level (logical value) of the cell. Due to inaccuracies during the programming procedure and charge loss due to time and temperature (also known as retention), the measured charge levels suffer from a random distortion.

Figure 1:
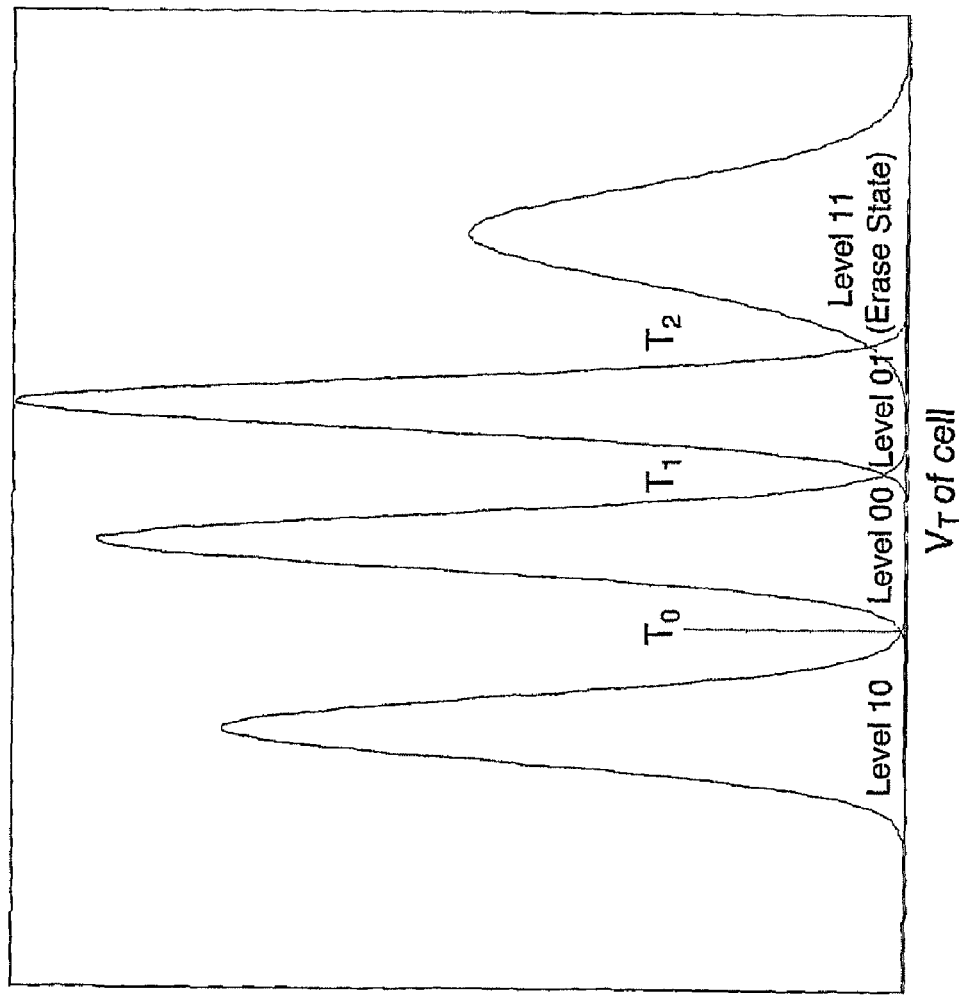
FIG. 1 is a prior art graph illustrating a superposition of several overlapping probability distributions of a flash memory cell which can be programmed with one of several respective program levels.

FIG. 1 is a superposition of 4 prior art voltage distribution graphs for each of 4 program levels 10, 00, 01 and 11. The graph illustrates an example of the four separate probability distributions of a cell which can be programmed with one of four corresponding program levels (10, 00, 01 and 11, respectively). For each distribution curve, the Y-axis represents the probability that the cell is programmed to the corresponding level, given the value of the charge level $V_T$ (represented by the x-axis). The voltage window (W) is the voltage difference between the means of the two extreme distributions (of levels 10 and 11). The difference between the means of two near distributions is denoted by D. Dotted vertical lines T0, T1 and T2 are used to denote decision thresholds distinguishing adjacent ones from among levels 10, 00, 01 and 11 which in the illustrated example is the erase state.

The cell's programmed level, or logical level, may be determined using several methods. One method is to apply a voltage to the cell's gate and measure if the cell conducts current. The cell has a certain threshold voltage such that if voltage above that threshold is applied to the gate, the gate may conduct. Below that threshold voltage the gate typically does not conduct current (or conducts a small amount of current, below a certain demarcation level). As the amount of charge in the cell changes this threshold voltage, the charge may be inferred by determining at which voltage the cells starts to conduct current. Thus, the programmed level is determined by iteratively applying different voltages to the gate and measuring whether the cells conduct or not. Another method is based on the fact that when applying a voltage above the threshold voltage, the cell conducts current and the amount of current depends on the difference between the applied voltage and the threshold voltage.

As the threshold voltage changes as a function of the amount of charge in the cell, the programmed level may be inferred by measuring the current going through the cell. Thus, the programmed level may be obtained by simultaneously comparing the conducted current with a given set of fixed currents distinguishing between all programmed levels. In other words, each cell's programmed level is determined by simultaneously comparing the $V_T$ level against several decision threshold levels. For example, if there are four possible programmed levels, the cell's $V_T$ is simultaneously compared against three decision threshold levels which divide the voltage axis to four regions, as demonstrated in FIG. 1. In general, if there are L possible programmed levels, L−1 decision threshold levels may be employed. Since the program level voltage distributions intersect, there is a probability of detection error, e.g. detecting the wrong program level.

Figure 2:
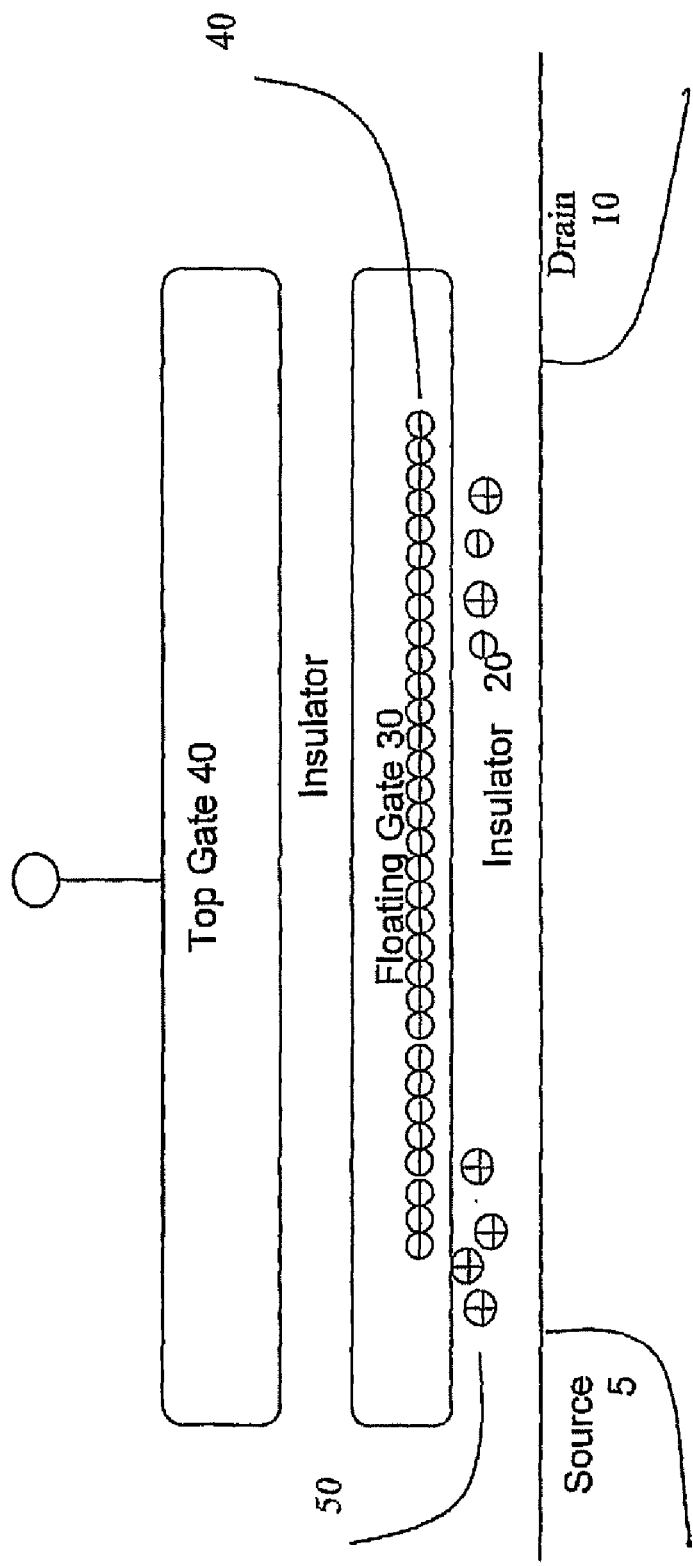
FIG. 2 is a simplified schematic illustration of a prior art floating gate cell.

FIG. 2 is a simplified schematic illustration of a prior art floating gate cell. The cell is constructed on top of the substrate or well. On each side of the cell are a source 5 and a drain 10. On top of the substrate is an insulator 20. On top of the insulator there is a floating gate 30, then insulator 20 and then the top gate 40.

During a programming procedure, the top gate is forced high (say 10V) while a current flows between the drain and the source by setting the drain to a moderately high voltage (say 5V) and setting the source to the ground reference voltage. In this process a negative charge is injected into the floating gate 30. This charge can later be detected by measuring the threshold voltage of the transistor. One possible scheme for erasing a cell is setting the gate to a relatively negative voltage (say −8V) and the well in which the cell lies to a relatively high voltage e.g. as per the channel erase scheme in FIG. 1 in Reference [1]). In this process the negative charge within the floating gate flows back to the well/substrate.

A cycle of program/erase also causes charge to be trapped in the insulator layer 20 (FIG. 2). More cycles may cause more charges to be trapped in this layer. The amount of charge which is trapped during the program/erase cycles is approx. proportional to the square root of the number of program/erase cycles ($\sqrt{cycles}$) [1]. Following a programming procedure and retention, a threshold shift occurs due to de-trapping. Furthermore, the number of traps is decreased following retention.

De-trapping has been cited as the dominant factor of threshold instabilities in sub-100 nm Flash memory devices (see [1] and [2]). De-trapping occurs when positive traps 50 (FIG. 2) in the insulator layer 20 suddenly recombine with electrons in the floating gate 30 or when charges flow to the substrate. The process of de-trapping is a random process and the de-trapping of different charges is approximately independent. Therefore, the average shift in the cell threshold distribution and the variance of the shift are linearly dependent on the number of traps (and non-linearly dependent on the retention time).

Variance of the cell threshold distribution following cycling and retention in the current Flash memory devices may be associated with de-trapping. This is the major reason for the low cycling limitations in higher density Flash memory devices (say 90-32 nm devices). Following a high number of consecutive program/erase cycles (say 100-1000), the number of traps causes a too large variance (following retention) to allow 3-bit, 4-bit and even 2-bit per cell devices to function reliably.

Though it may not necessarily stem from the same physical processes, NROM devices may exhibit a similar reaction to cycling: the voltage distributions of their program levels may widen quickly following retention due to the consecutive cycling.

Relevant to certain embodiments of the present invention is also the interface to Flash memory devices, in particular NAND Flash memory devices though this specification is also applicable to NOR devices. NAND Flash memory devices are organized into (physical) pages. Each page contains a section allocated for data (say 512 bytes, 2K bytes, 4K bytes) and a small amount of bytes (16-32 bytes for every 512 data bytes) containing, typically, redundancy and back pointers. The redundancy bytes are used to store error correcting information, for correcting errors which may have occurred during the page Read. Each Read and Program operation is performed on an entire page. A number of pages are grouped together to form an Erase Block (EB). A page cannot be erased unless the entire erase block which contains it is erased (e.g. each erase block may comprise 128 pages). A Flash memory device may comprise thousands or tens of thousands of such erase blocks.

An important measure of a Flash memory device quality is the number of times (Np) it may be reprogrammed (e.g. program/erase cycles) and the period that it can store data (usually 10 years) before irrecoverable errors occur. The higher the number of program-erase cycles, the higher the bit error rate (BER). Thus, today's MLC devices can perform around Np=1000 cycles for 10 years retention before the allocation of 16-32 bytes of redundancy per 512 bytes of data bytes becomes insufficient to correct errors. SLC devices usually perform better but obtain a much lower density and hence they are priced higher. Following Np program-erase cycles the device is still operational but the bit error rate is higher.

One application of Flash memory devices is solid state disks (SSD) where an array of Flash memory devices is used as the storage media of a computer hard drive, thus, enjoying the fast Read and Access times of Flash chips. In an SSD, several Flash chips are programmed and read simultaneously to increase the Read and program speeds. It is the norm today to guarantee Hard Disk operation for 3 years. Noting that the new and denser MLC Flash memory devices may not operate reliably above 1000 cycles or less, this drastically reduces the number of complete updates the SSD is able to endure per day (e.g. less than 0.25 complete updates a day as described in Reference [3] above).

Certain embodiments of this invention seek to counter the effect of cycling and allow almost a limitless or drastically larger amount of program/erase cycles. This is done by allocating a constant or variable number of (spare) erase-blocks which are temporarily retired, typically for a fixed time or at least a fixed time. During this time, de-trapping occurs which reduces the number of traps in the cells and thus, countering the effect of cycling. That is, following the temporary retirement, the devices behave as effectively suffering from less program/erase cycles. Certain embodiments of this invention are suitable for applications in which there is a limit on the number of complete updates a system (such as an SSD) handles per day or per given amount of time. Thus, following retirement as described herein, retired erase blocks become "fresher" and behave as if they have suffered less cycles.

As described above, certain embodiments of this invention seek to counter the effect of cycling and may allow an almost limitless or drastically larger amount of program/erase cycles to be performed without unacceptably affecting memory quality. This is done by allocating a constant or variable number of (spare) erase-blocks which may be temporarily retired, typically for a fixed time or at least a fixed time.

Although certain embodiments of this invention are described in terms of processes occurring in Floating gate devices, this is not intended to be limiting. Similar processes may occur in NROM devices and certain embodiments of this invention which employ temporarily retired erase blocks are also applicable to NROM devices.

For example, n+1 memory portions may be provided in conjunction with a controller which serves a data-employing application which employs no more than n memory portions at any given time. The controller may use the first n memory portions to serve the data-employing applications, except that each of these n portions is "retired" in turn, for a period during which its data is first copied into the (n+1)th memory portion and re-copied back again at the end of the period. Each copying operation may comprise any suitable reproduction of the data in question, either by direct reference to the memory portion copied from or indirectly e.g. via temporary memory. Typically each reproduction of data comprises reading of physical values from their current memory location, de-mapping thereof to obtain ECC-coded logical values, decoding thereof including error correction, mapping of the decoded corrected logical values into physical values, and programming those physical values into a new memory location.

The periods of retirement are typically equal for all n memory portions and are typically followed by a period in which the (n+1)th memory portion is itself retired hence not used to retire any of the first n memory portions. Timing of periods of retirement may be via a clock. In the absence of a clock, retirement periods may be timed approximately, by reference to an event whose frequency is assumed to be randomly distributed, such as but not limited to erase requests to the entire memory, program requests to the entire memory, or write requests to the entire memory.

In the described embodiments of the present invention, the use of the terms flash memory, flash memory device, flash memory apparatus, solid state disk, memory device etc. is non-limiting (also referred to in general as "storage apparatus"). In certain embodiments of the present invention, the elements associated with the storage apparatus as well as the sequence of operations carried, are integral to the storage apparatus. In certain other embodiments of the present invention, at least some of the elements associated with the storage apparatus and at least some of the related operations are external to the flash, the solid state disk etc. For example, some of the operations performed by microcontroller 110 of FIG. 3B may be carried out by the central processing unit of the host 100, without limiting the scope of the present invention.

Figure 3A:
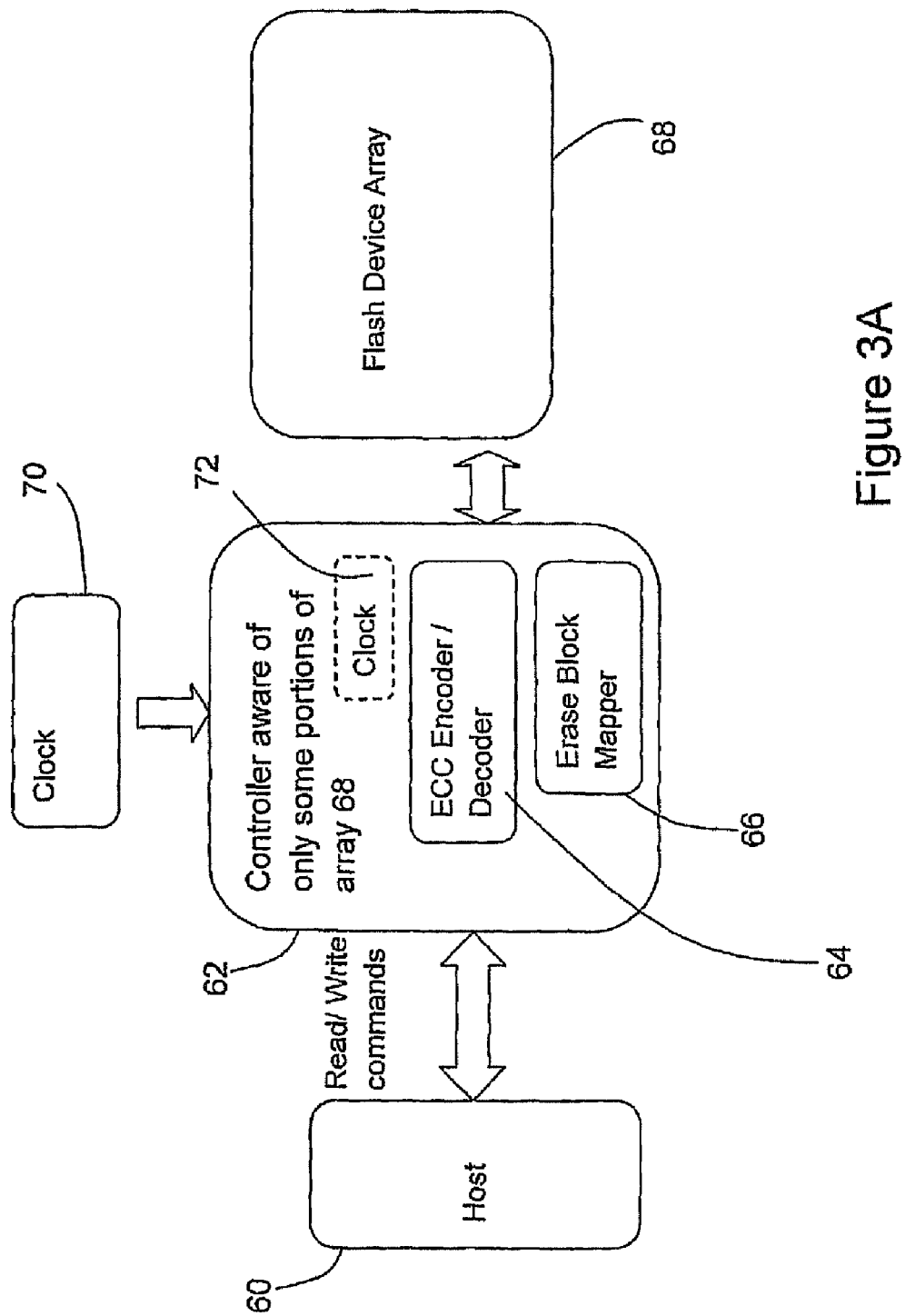
FIG. 3A is a simplified block diagram illustration of a Solid State Disk (SSD) system constructed and operative in accordance with certain embodiments of the present in invention in which a controller is operative to reserve for data retention purposes, for at least a first duration of time, only certain portions from among a plurality of memory portions actually provided.
Figure 3B:
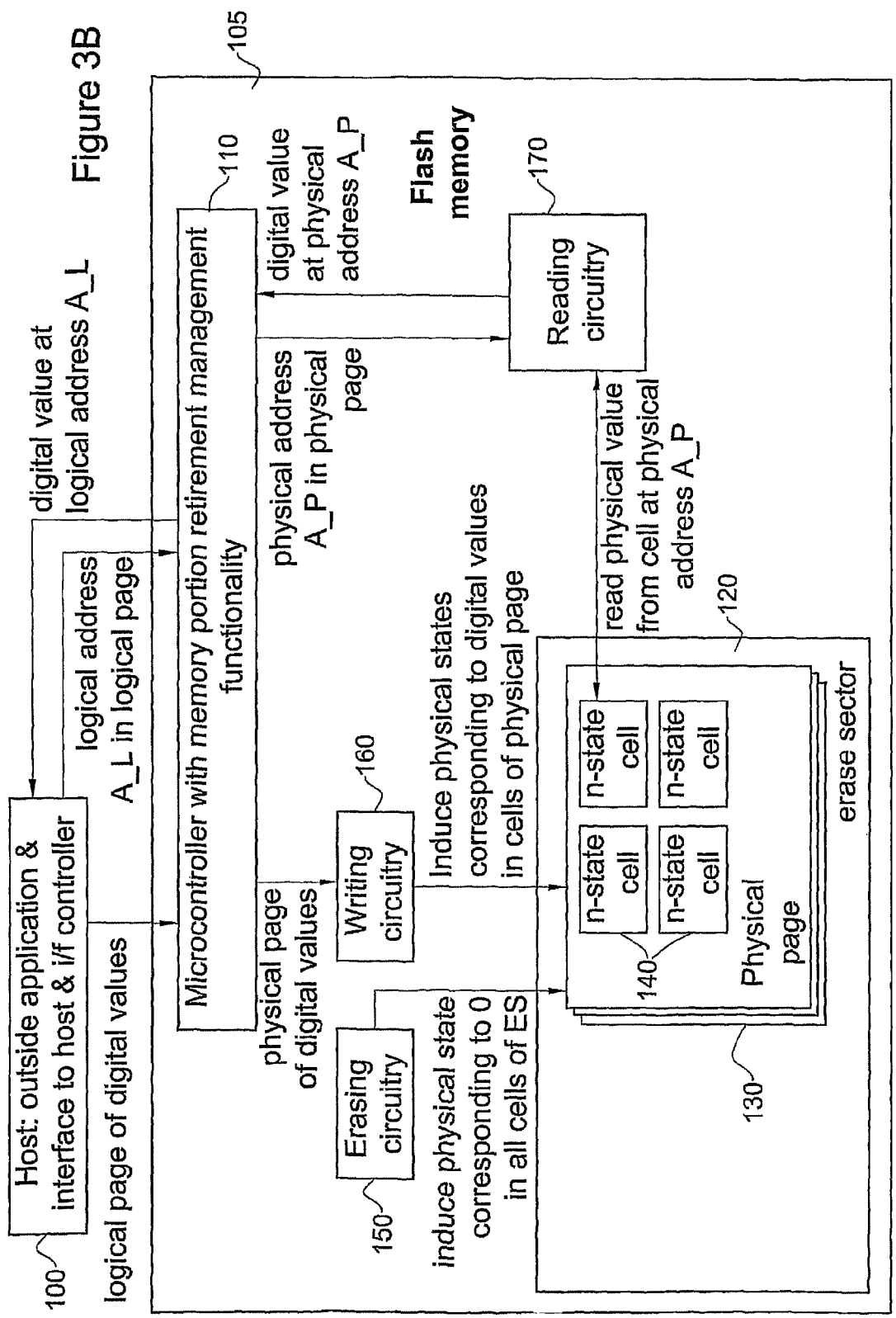
FIG. 3B is a simplified block diagram illustration of a flash memory system in which an internal microcontroller has a memory portion retirement management functionality constructed and operative in accordance with certain embodiments of the present invention.

For convenience only, the following description of certain embodiments of the present invention refers mainly to the term flash memory or solid state disk, however those versed in the art will readily appreciate that the embodiments that are described with reference to flash memory or solid state disk are likewise applicable mutatis mutandis to any storage apparatus which includes at least one memory portion affected by De-trapping. Certain embodiments of the present invention are described herein with specific reference to a Solid State Disk (SSD) however this is merely exemplary and is not intended to be limiting. Certain embodiments of this invention are applicable to many other applications such as but not limited to SD cards and USB drives. FIG. 3A is a simplified functional block diagram of an SSD. The host 60 is the computer which connects to the controller through some standard interface, such as but not limited to SATA and SAS, and sends read and write commands (e.g. SCSI commands) to the disk. The Controller 62 manages the interface between the disk and the host and translates these commands to appropriate program, read and erase commands to the Flash memory device array 68.

The Flash memory device array 68 includes one or more Flash memory devices which may be read or written individually or in parallel. The Controller 62 is conventionally operative to adapt the standard read\write requests of the host 60 to the limitations of the Flash memory however in contrast to conventional controllers, the controller is aware of only some portions of the array 68. Flash memory limitations may include: Block erase requirement, page program requirement, wear leveling for handling the program/erase cycling limitations and the slow times needed for erasure. Many examples of systems are known in the art (e.g. [4] and [5]). It is assumed that there is already an algorithm in the microcontroller which outputs commands for Block Erase, page program and page read. It is appreciated that this algorithm may be modified so as to build in "retirement" considerations as presented herein, typically including programming the controller to be aware of only some portions of the array 68.

According to certain embodiments of the present invention, a virtual map of those erase blocks is created for the physical erase block characterized in that there are less logical erase blocks in the virtual map than there are physical erase blocks. That is, the software of controller 62 is aware of only a portion of the actual physical erase blocks.) This allows several erase blocks to be temporarily retired at any given time.

An additional function may be added to the controller software, the erase block mapper 66, which remaps the erase blocks to their physical locations. One way to realize this function is to use a table which maps the logical erase block addresses to their physical erase block addresses and the locations of the "retired" erase blocks. In addition to the physical location of the erase block, space is also typically provided for a cycle-count and a time-stamp for each erase block. Such a table is illustrated in FIG. 5B. The cycle count counts the number of times a certain physical block has been programmed and erased. The physical erase block's time-stamp is used to determine the duration of time that elapsed since a certain erase block has gone into retirement e.g. the difference between the time stamp and the current time.

The file-system software performs conventional wear-leveling over the logical erase blocks, striving to maintain the same number of erase/program cycles for all erase blocks.

Beyond a certain number of program/erase cycles, the program level voltage distributions become so wide that the ECC decoder 64 is no longer capable of correctly deciphering a page. Cs is defined as the number of program/erase cycles up to which a decoder is guaranteed to work with a predetermined level of very high reliability. By retiring erase blocks certain embodiments of the present invention can ensure that the effective program/erase cycle count never increases much beyond Cs as described in detail herein.

Figure 4:
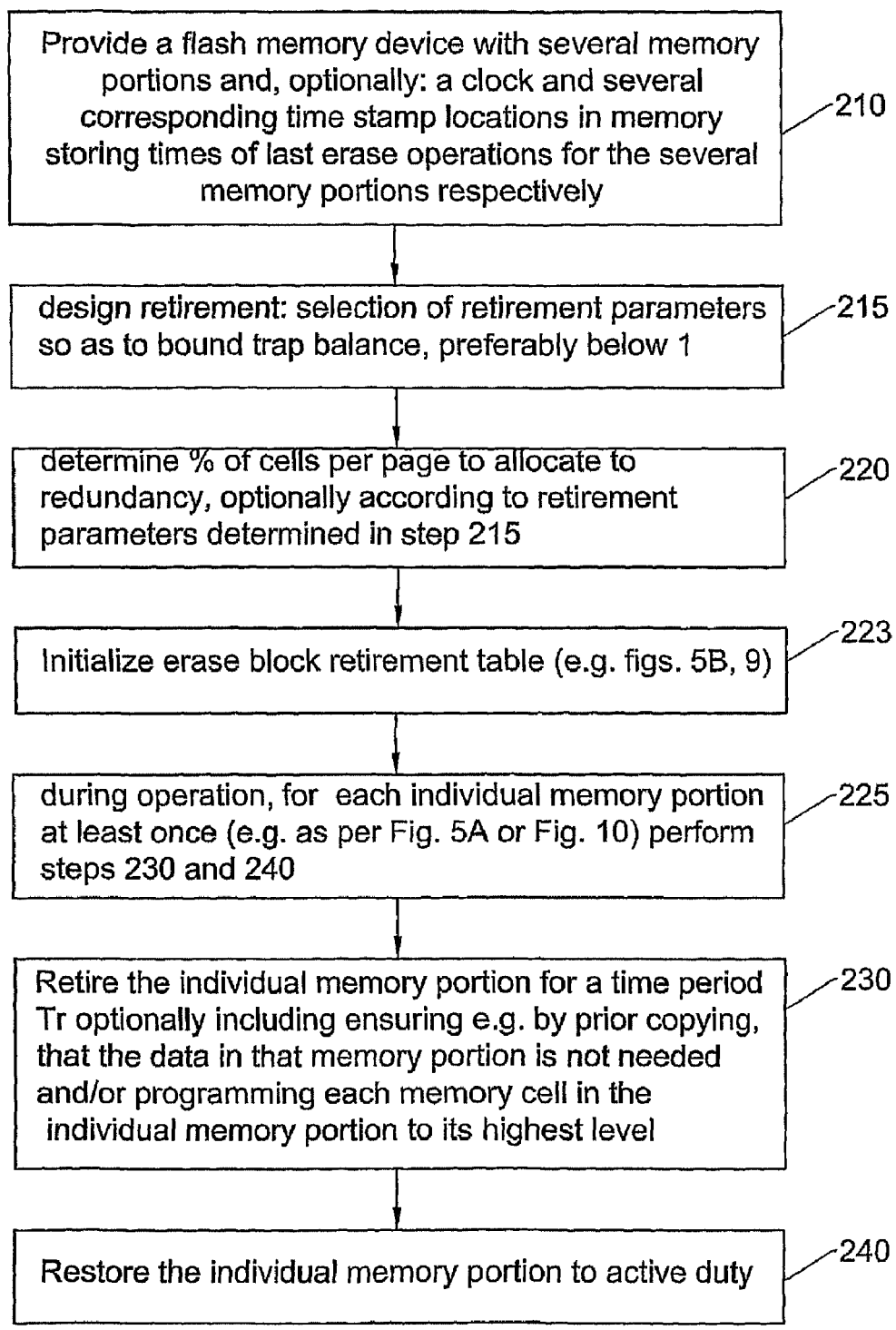
FIG. 4 is a simplified flowchart illustration of a method, constructed and operative in accordance with certain embodiments of the present invention, for using less than all of the memory capacity of a flash memory device, thereby to allow some and typically all portions of the total memory capacity of the flash memory device to retire intermittently for selected periods of time.

FIG. 4 is a simplified flowchart illustration of a method for providing and using less than all of the memory capacity of a flash memory device, thereby to allow some and typically all portions of the total memory capacity of the flash memory device to retire intermittently for selected periods of time. The method of FIG. 4 typically comprises some or all of the following steps, suitably ordered e.g. as shown:

Step 210: Provide a flash memory device with several memory portions and, optionally: a clock and several corresponding time stamp locations in memory storing times of last erase operations for the several memory portions respectively Step 215: design retirement: selection of retirement parameters so as to bound trap balance, preferably below 1 (e.g. using FIG. 6)

Step 220: determine % of cells per page to allocate to redundancy, optionally according to retirement parameters determined in step 215

Step 223: initialize erase block retirement table (e.g. the table of FIGS. 5B, 9)

Step 225: during operation, for each individual memory portion at least once (e.g. as per FIG. 5A or FIG. 10) perform steps 230 and 240 which may be as follows:

Step 230: Retire the individual memory portion for a time period Tr optionally including ensuring e.g. by prior copying, that the data in that memory portion is not needed and/or programming each memory cell in the individual memory portion to its highest level Step 240: Restore the individual memory portion to active duty Step 250: during operation, e.g. periodically, update effective cycle of all active blocks; typically, the same is done for retired blocks automatically as they are put back into service.

Figure 5A:
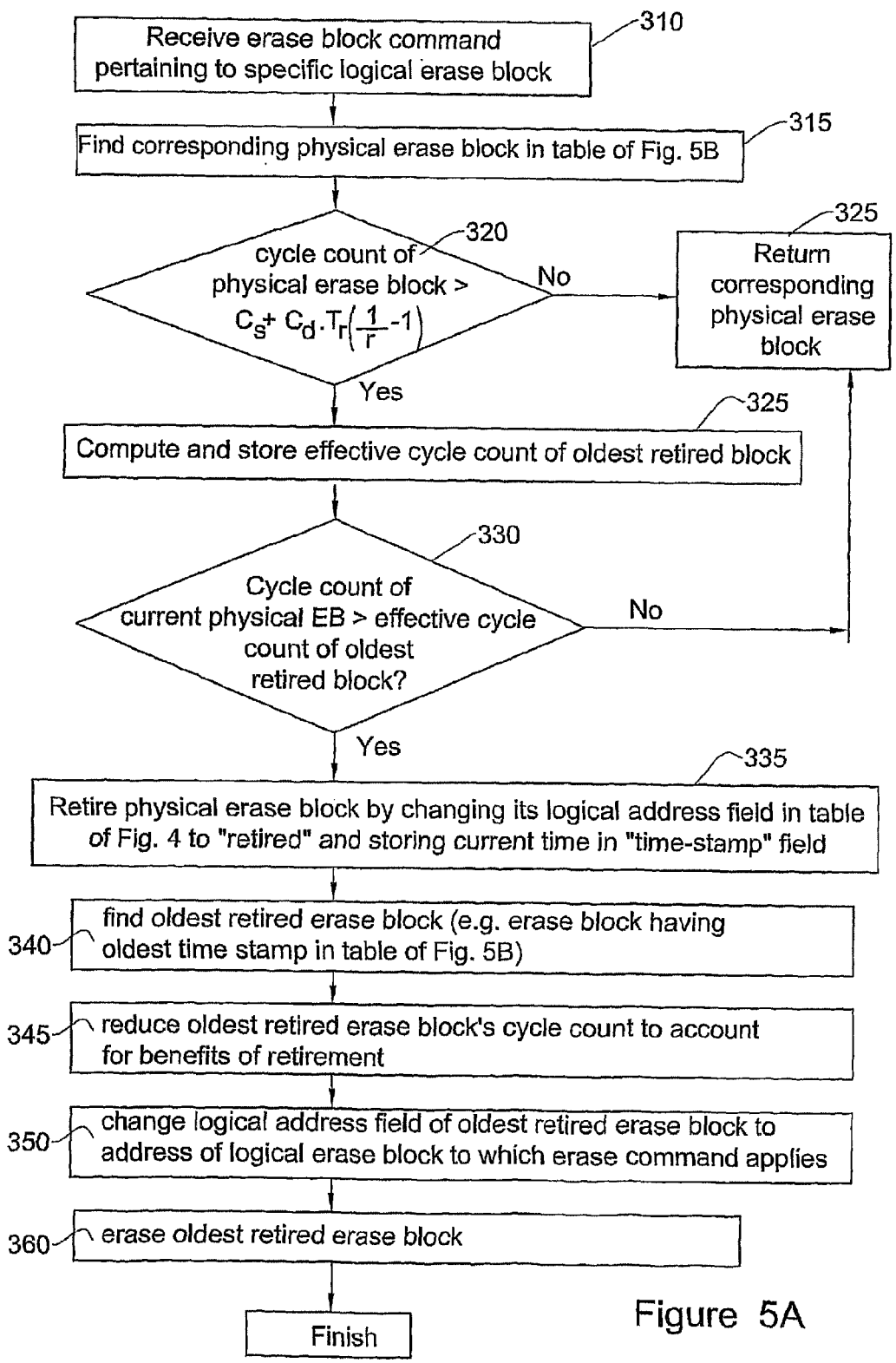
FIG. 5A is a simplified flowchart illustration of a memory portion retirement process including erase block mapping, which process is operative in accordance with certain embodiments of the present invention and which may be performed during operation of the system shown and described herein. The method of FIG. 5A is a suitable implementation of steps 25, 30 and 40 of FIG. 4 and forms a suitable method of operation for the erase block mapper of FIG. 3A, all in accordance with certain embodiments of the present invention in which a cycle count is stored for each memory portion and the controller includes a clock to record times at which various memory portions are erased.

FIG. 5A is a simplified flowchart of the operation of the erase block mapper 66 each time an erase block command is generated by the controller software, according to certain embodiments of the present invention. This is typically the beginning of another Program/Erase cycle. The erase block map function block checks (step 320) if the physical erase block (mapped by the logical erase block) has undergone more than a certain number of cycles, say Cs+Cdelta. If that is the case, the effective cycle count is computed (step 325) from the cycle count number stored in the table of FIG. 5B and the time elapsed since the block was retired, typically taking into account de-trapping that may have occurred, e.g. using step 530 of FIG. 8.

The erase block mapper 66 of FIG. 3A checks (step 330) if the effective cycle count of the retired block is less than Cs+Cdelta. If that is the case, the physical erase block address which was originally mapped to the logical erase block address is retired (step 335) and the oldest retired erase block is taken out of retirement (steps 340-350) During this process the effective cycle count for that block is computed, the logical erase block address is mapped to the new erase block (step 355) and an erase operation (step 360) is performed on the new erase block.

The method described does not use a constant retirement time, relying instead on the assumption that the rate of erase block requests (i.e. cycling) does not exceed the threshold Cd.

As long as the erase block request rate is no greater than Cd, the retention time will be at least as large as the computed Tr value.

An example of the above process is shown in FIGS. 5B-5E. The oldest retired block in the tables of FIGS. 5B and 5C is "retired4". FIGS. 5D and 5E show how the table changes one hour and 2 additional erase requests later; and approximately two hours and 3 additional erase requests later respectively, relative to an initial state of the table shown in FIGS. 5B and 5E.

The above process may be improved by once in a while, perhaps periodically e.g. every few days, having the function block 66 (FIG. 3A) go through the entire table e.g. of FIG. 5B and update the effective program/erase cycles, taking into account not merely the number of cycles undergone by each erase block, but also the estimated extent to which each erase block has recuperated from these cycles, typically merely as a result of a continuous time period of suitable duration having elapsed since these cycles occurred. According to this embodiment, in steps 320 and 330 the "cycle count" of the current physical erase block is then not the physical number of cycles undergone by the current physical block, but rather the effective cycle count of the current physical block (the physical number, adjusted for estimated effects of recuperation) e.g. as computed in step 530 of FIG. 8.

Figure 8:
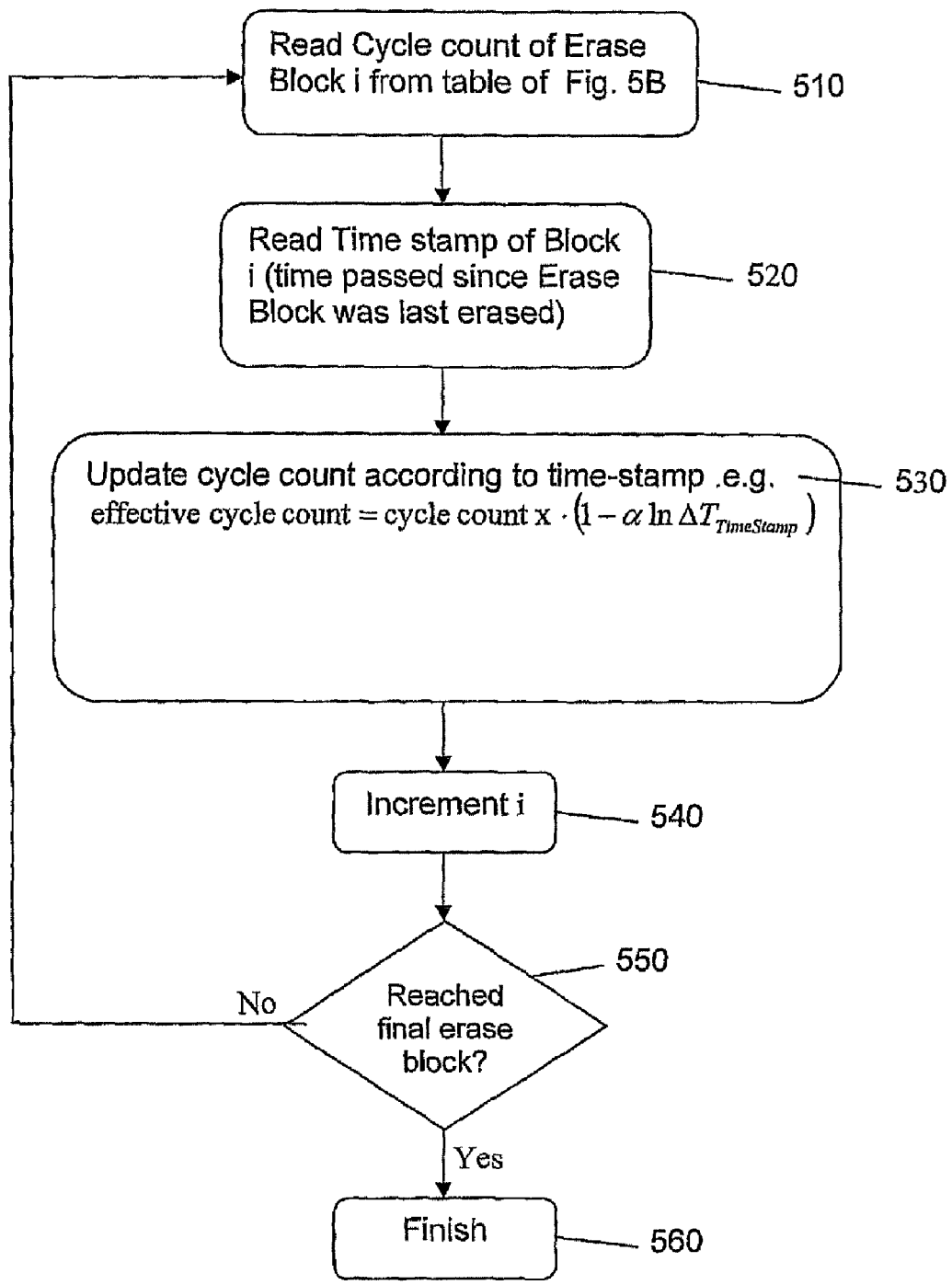
FIG. 8 is a simplified flowchart illustration of a method, constructed and operative in accordance with certain embodiments of the present invention, for computing an effective cycle count for each active block.

In order to facilitate direct computation of the effective cycle count a time stamp since the last erase operation may be stored for all the active blocks as shown in FIG. 5B, however this is optional as shown in FIG. 5C. For example, a time stamp may be stored for each non-retired block as well as each retired block, the time stamp indicates the time of the last block Erase operation. The estimated extent of de-trapping process (or other spontaneous memory quality recover process) which may have occurred since the last erase operation, specifically, may be used as an indicator of recuperation e.g. as shown in FIG. 8. A particular advantage of the embodiment of FIG. 8 is that it does not require much or any information regarding the durations of time between consecutive erase/write cycles to be stored, such that it is not necessary to store the time-stamp for the active blocks as is done in certain embodiments of the invention as shown in FIG. 5B.

Computation of the effective cycle count following a certain period of retirement may or may not be based upon a physical model of the Flash memory device. In [1] the authors propose a model where the fraction of traps which disappear at room temperature during time Tr (retirement time) is given by $\alpha \log(T_r)$ for some constant the trap dissipation rate which depends on the Flash technology being used and the temperature. As the traps are the main contributors for endurance degradation (at technologies of <100 nm), the disappearance of traps may be viewed as effectively decreasing the cycle count.

According to certain embodiments of the present invention, the cycling working point, Cs, the average number of entire flash array program/erase cycles per day, Cd, and the proportion of erase blocks which is allocated for retirement purpose, r, may be used to find a suitable retirement time, Tr. Tr is useful in determining a highest cycle count suitable to trigger retirement, e.g. as per the following formula: $Cs+(1/r-1)*Cd*Tr$. If this cycle count is too high then r may be larger. If the cycle count is within the range of cycles=Np which can be managed following 10 year retention then the r value is suitable and need not be changed. For example, the retirement time, Tr, may be selected to minimize the number of traps following retention e.g. which minimizes the following function (Formula I):

$$f_{Trap\ balance}(C_s, C_d, r, T_r) = \sqrt{\frac{C_s + \left(\frac{1}{r} - 1\right) \cdot C_d \cdot T_r}{C_s}} \cdot (1 - \alpha \ln T_r)$$

$f_{Trap\ balance}$ is the average balance between the rate of program requests (as it manifests itself in Cd) and the de-trapping which occurs during retirement. As long as $f_{Trap\ balance} < 1$, the program/erase cycles do not accumulate and the device may work well beyond the "official" endurance limitations of the device which may for example be 1000 cycles.

The above function may be used to reduce, e.g. optimize, Cs; smaller values of Cs allow more relaxed conditions to be used on the redundancy as less errors need be corrected. Alternatively or in addition, the above function may be used to compute an appropriate e.g. optimal number of retired erase blocks to provide so as to ensure that $f_{Trap\ balance} < 1$. Optimization may be effected by choosing the smallest possible r for which there exists a Tr such that $f_{Trap\ balance} < 1$. Optionally, there is a limit on the largest Tr under consideration, because, as described above, if Tr is too large, just prior to retirement, too many cycles (Cs+Tr*(1/r−1)*Cd cycles) may occur, which may create difficulties after a long period such as 10 years has elapsed, at which point the bit error rate may be too high.

For example, the following Formula II may be employed:

$$\min r$$

$$\text{s.t.} (\min_{T_r} f_{Trap\ balance}(C_s, C_d, r, T_r)) \leq 1$$

In the above, "s.t." is "such that". The above optimization may, for example, be effected by exhaustive computerized search over r and Tr, where variable Tr varies, say, from 0.1 hour to 100000 hours in steps of size 0.1 hours, variable r varies, say, from 0.01 to 0.5 in steps of size 0.01.

It is appreciated that the embodiment of FIGS. 4-5A is only one example of possible systems in which portions of memory such as flash memory are "retired" from time to time and, typically, subsequently restored to memory retention service. The particular features of the embodiment of FIGS. 4-5A above and beyond the above characterization are merely exemplary of many possible variations. For example:

1. It is possible for data having a particular logical address A to exclusively reside in only two physical addresses, rather than potentially being rotated between many possible physical addresses: either a normal physical address which always corresponds to A, or a single additional physical address always used if A is in retirement and typically only if A is in retirement, which may serve as the additional address for other logical addresses other than A. For example, 11 (say) memory portions may be provided, having a retirement scheme whose length is 11T days. Each of the first 10 memory portions retires for a time period of length T, during which time the eleventh memory portion replaces it, and for the last period of length T, the eleventh memory portion itself retires.

2. Memory portions may be retired in turn or in order of the importance of their data or by any other criteria, rather than necessarily in order of need.

3. Memory portions may be retired periodically or in slack periods or in accordance with any other schedule, rather than responsively to erase commands necessarily.

4. The number of memory portions retired at any given moment need not be constant and may vary over time, particularly if demands on memory and/or the amount of data stored in memory tend to vary over time.

5. If in certain technologies or applications there are "diminishing returns" in the sense that erase blocks rejuvenate significantly if retired for a specific time period and do not rejuvenate significantly if retired for a longer time period, then a time-out may be used such that each retired erase block is restored to active duty after the specific time period has elapsed so as to get another erase block into retirement as fast as possible, even if no other erase blocks are in immediate need of retirement i.e. even if all active erase blocks are still acceptably operational.

The term "retirement" of a memory portion is used herein to mean at least one of and typically all of the following, occurring sometime in the course of a typically finite period of retirement or throughout that period:

a. Optional—copying data from that memory portion to another b. Optional—applying heat to the memory portion and/or increasing voltage levels or otherwise increasing rate of rejuvenation i.e. increasing extent of memory portion rejuvenation in a given time period or to decreasing the time period required to achieve a given extent of rejuvenation.

c. Refraining from reading data from the memory portion if the rejuvenation process causes or is thought to cause deterioration of data quality.

d. Erasing or over-writing data, preferably as the period of retirement finishes, if the rejuvenation process causes or is thought to cause deterioration of data quality.

Figure 6:
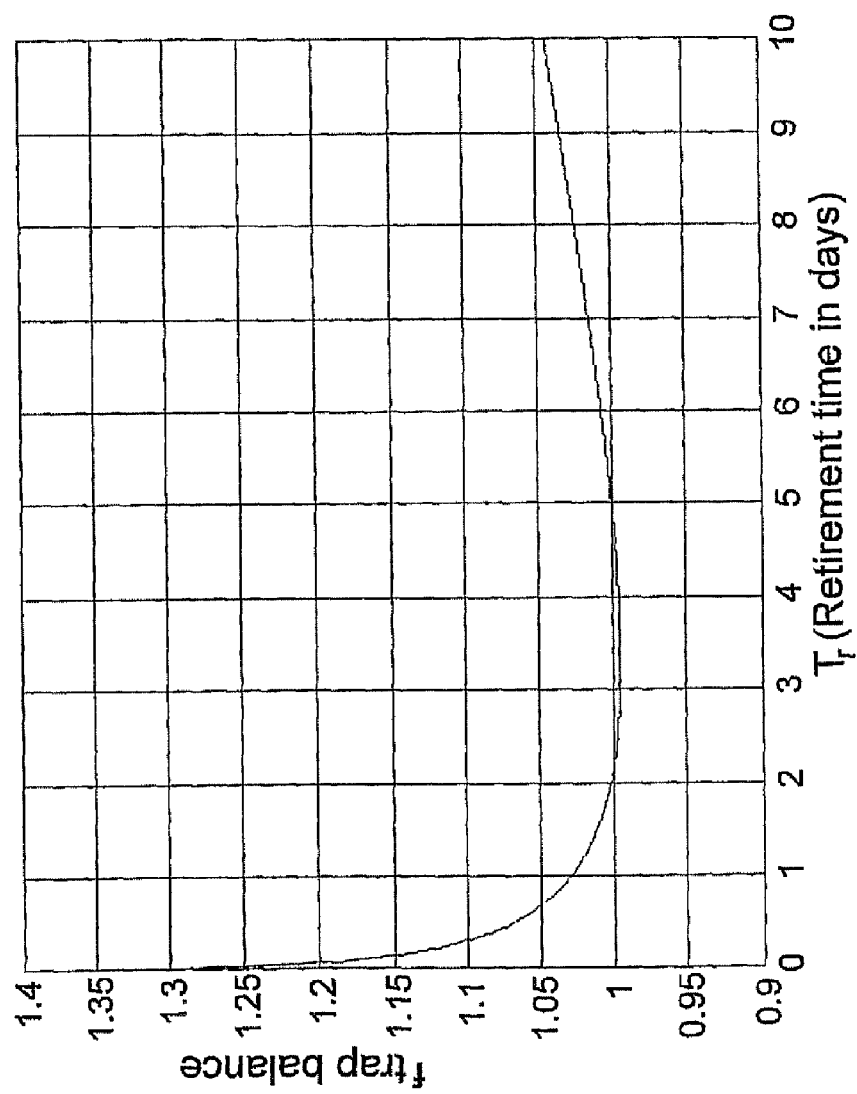
FIG. 6 is a graph illustration of trap balance in an erase block as a function of the period of time, Tr, which has elapsed from the time of occurrence of the erase block's first cycle until the present, assuming a constant (and unit-less) trap dissipation rate alpha=0.0761. The theoretical significance of the trap dissipation rate parameter is described in Reference [1], e.g. in connection to FIG. 5B in that reference. It may be used to compute the proportion of traps that have been detrapped following a given retention time (in hours) and assuming a temperature of 55 degrees Celsius. In the illustrated example the following are assumed: a pre-determined cycling working point at which the flash memory is still working well despite the number of cycles it has undergone (e.g. 1000), a constant number of cycles, e.g. 6, undergone by the flash memory in total (over all erase blocks) and a predetermined proportion of erase blocks (e.g. 10%) allocated to retirement at any given time.

FIG. 6 shows a numerical example of a device whose (unit-less) trap dissipation rate is 0.0761 at 55 degrees Celsius and whose working point Cs is 1000 cycles and the time in formula I is given in hours (translated to days in the graph). Furthermore it is assumed that r=1/10 of the blocks are allotted for retirement at any one time. The graph shows that the trapping balance is favorable if the retirement time is approximately 3 days. After about 3 days, the number of cycles is approximately:

$$C_s + C_d \cdot T_r \cdot \left(\frac{1}{r} - 1\right) = 1162 \text{ cycles} \quad \text{(formula III)}$$

in those erase blocks that were not retired. Therefore, for this example, an appropriate value for Cdelta in the method of FIG. 5A is 162 cycles. This value ensures that once the system stabilized (many erase cycles have elapsed), blocks have between 1000 and 1162 cycles. As is apparent from. FIG. 6, when r=1/10 and Tr=3 days the trap balance function is balanced.

It is appreciated that retirement management schemes in accordance with the present invention need not store a cycle count for each block and need not use time stamping of the retired blocks.

Figure 10:
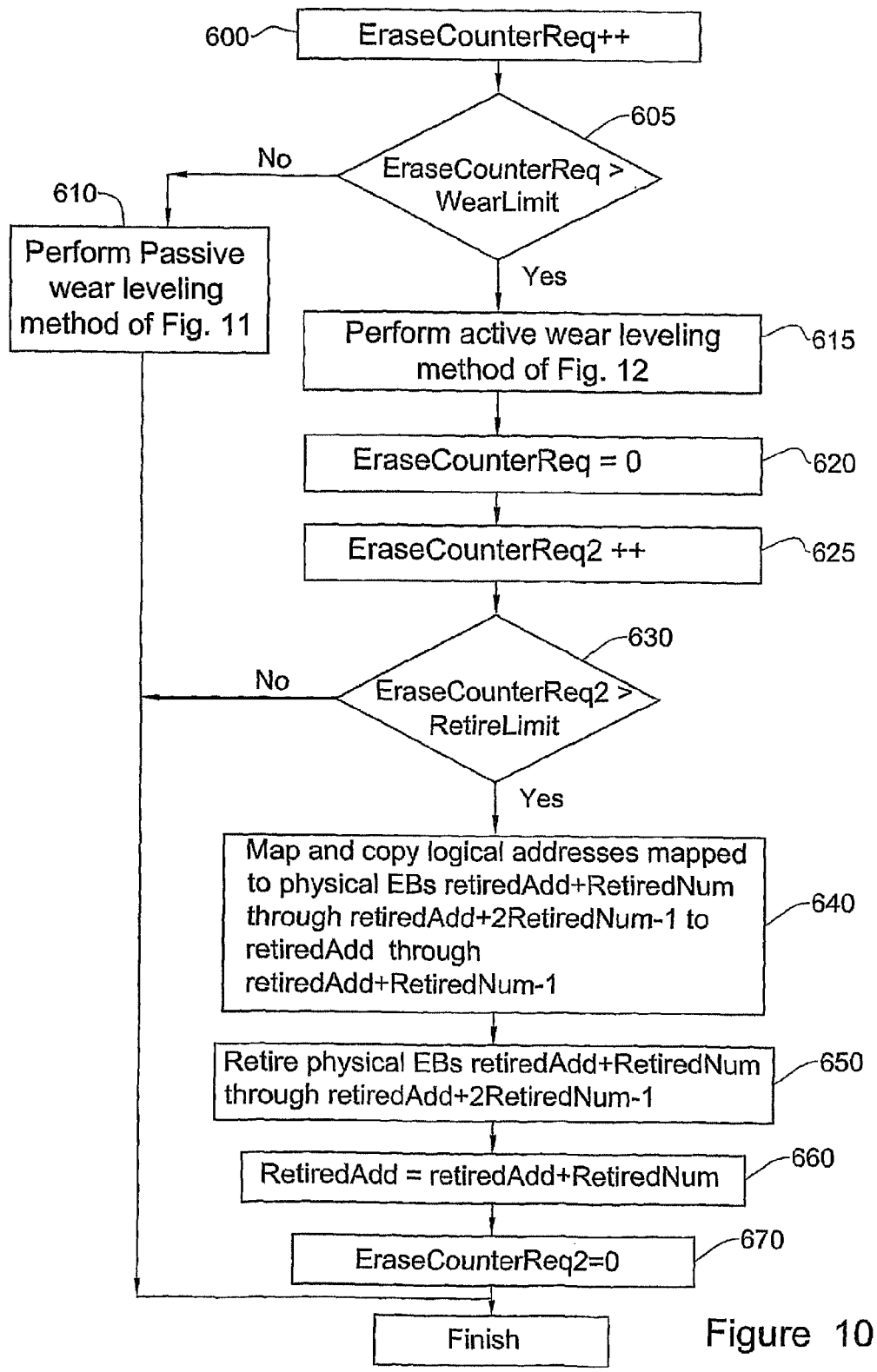
FIG. 10 is a simplified flowchart illustration of a memory portion retirement process including erase block mapping, which process is operative in accordance with certain embodiments of the present invention and may be performed during operation of the system shown and described herein. The method of FIG. 10 is a suitable implementation of steps 25, 30 and 40 of FIG. 4 and forms a suitable method of operation for the erase block mapper of FIG. 3A, all according to certain embodiments of the present invention in which no cycle count is stored for each memory portion and no clock is available to record times at which various memory portions are erased.
Figure 11:
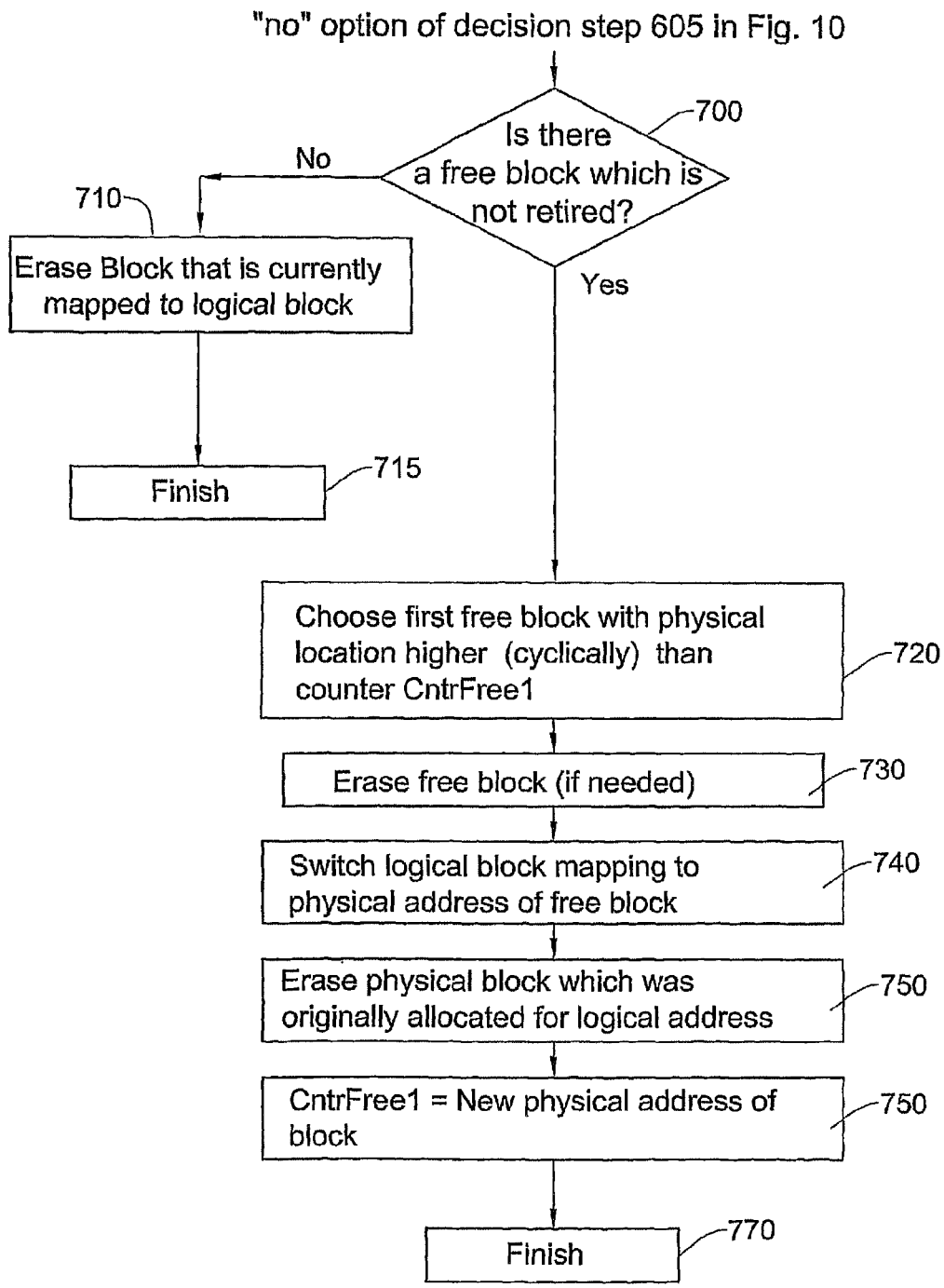
FIG. 11 is a simplified flowchart illustration of a passive method for performing the Passive wear leveling step of FIG. 10 in accordance with certain embodiments of the present invention.

Reference is now made to FIGS. 9-11 which pertain to an embodiment characterized in that no time stamping and no cycle counter are employed. Instead, the total number of block erasing commands issued to the flash memory device as a whole may be recorded. It is assumed that the time intervals between these commands are random such that occurrence of a block erasing command is statistically or approximately indicative of elapsed time. It is appreciated that alternatively, occurrence of any other suitable discrete event, or the progress of a continuous event, may be used as a timing event.

Suitable discrete events other than occurrence of erase commands may include, in certain applications, occurrence of read requests and/or write requests.

A table is provided mapping logical blocks to physical blocks as shown in FIG. 9. Initially, the table may be initialized such that a portion r of the blocks, perhaps the last blocks as shown, are retired and all the logical erase blocks are mapped, say, to physical erase blocks with the exact same index. Each time a new block is erased, a set of procedures, as shown, is performed, at the end of which the same or a different physical address may be allocated to a certain logical block address. Also, every once in a while, new physical blocks retire and other erase blocks are brought back from retirement as described in detail below. In the description below, the following constants may be employed:

RetiredNum=the number of erase blocks which are retired at once.

WearLimit=A wear limiting parameter intended to allow statistical wear leveling of the blocks which are not retired. Wear leveling may be passive or active. Alternatively, both types of wear leveling may be employed, and the ratio between the extent of use of the two types is determined by WearLimit. In passive wear leveling, each time an erase operation occurs, the method seeks an empty erase block to use instead of the original one. This method may not be "fair" toward the various erase blocks since an erase block which was programmed years ago and has gone through only one cycle may remain in that state whereas the last few erase blocks which are still not filled may be cycled endlessly. For that reason, typically, active wear-leveling is performed occasionally; in active wear leveling, some of the erase blocks which are storing information are rotated with or replaced by erase blocks which are free. WearLimit determines the ratio between active and passive wear-leveling.

RetireLimit=A parameter which determines the number of erase operations which may occur before new erase blocks are retired and old erase blocks are brought back from retirement.

In order to allow wear leveling even when a cycle count is not available statistical wear leveling is used and two types of procedures may be employed when an erase block command is requested. The first one is performed by the procedure detailed in FIG. 11 and is the most frequently used. This procedure typically erases the physical block allocated for the given logical erase block and then maps the logical erase block to a new free erase block (if one exists). The second procedure is detailed in FIG. 12 and is intended to statistically wear level the erase blocks. This procedure ensures that once in a while a logical erase block is mapped to a different physical erase block.

Step 700 seeks a free block which is not retired. If no such block is found, then the current erase block is erased and the table of FIG. 9 remains unchanged (step 710). If there is a free block, then a free block with an address higher than CntrFree1 is chosen and the logical erase block address is mapped to the new physical erase block address (steps 720 and 750). CntrFree1 is updated to point to the new address, The use of CntrFree1 ensures that all free erase blocks are considered rather than merely a sub-set thereof.

Figure 12:
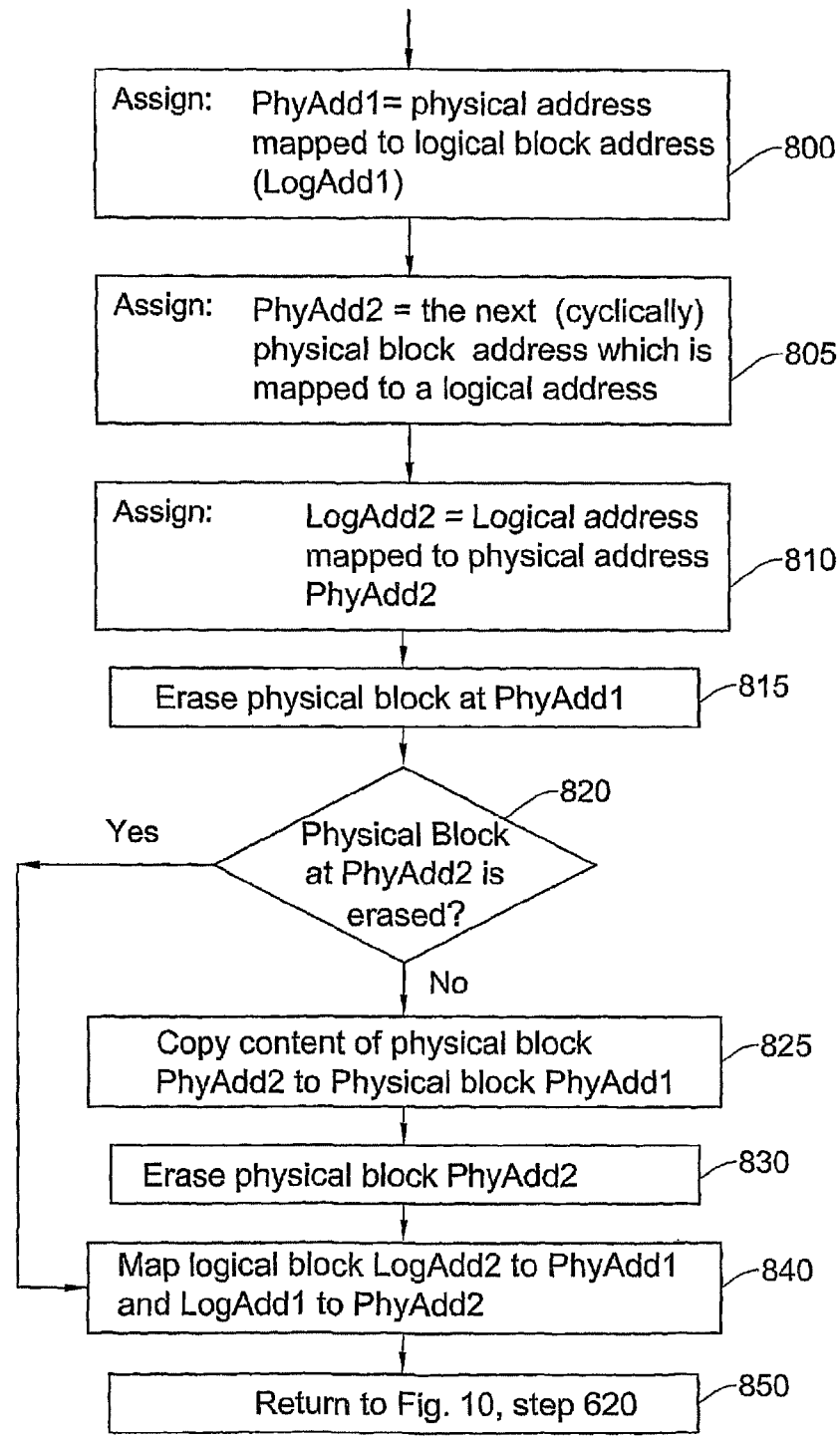
FIG. 12 is a simplified flowchart illustration of a method for performing the Active wear leveling step of FIG. 10 in accordance with certain embodiments of the present invention.

In the methods of FIGS. 11 and 12, a "next" available physical block is used (step 720 in FIG. 11, step 805 in FIG. 12). The "next" block typically refers to a physical block which is not retired and whose address is, say, higher (or lower), than a predetermined reference (cntrfree1 in the illustrated embodiment). If no such block exists, the search cycles, continuing from address 1 (or the last address).

The management is defined in FIG. 10. This figure shows how most Erase requests are performed by the first procedure and every one in the WearLimit request is done using the second procedure. Furthermore, every RetireLimit time the second procedure is applied, new blocks are retired and old blocks (RetiredNum blocks) are taken out of retirement. RetireLimit is chosen such that on average the blocks are in retirement for a period of Tr. This is done by taking into account the average number of erase requests per time unit ERn such that RetireLimit=Tr/ERn/WearLimit.

It is desirable to enhance the effect of retirement e.g. by accelerating the rehabilitating processes assumed to occur during retirement, such as de-trapping. Generally, the larger the de-trapping during endurance, the less retired erase blocks needed or, alternatively, the working point Cs can be made smaller. Making the de-trapping larger is equivalent to making the trap dissipation rate larger. According to certain embodiments of the present invention, de-trapping is accelerated by programming the memory portion intended to be retired to a high voltage level such as the highest possible voltage level just before retirement. In some cases, higher numbers of electrons in the floating gate may increase the de-trapping rate.

According to certain embodiments of the present invention, the de-trapping rate is accelerated by heating the Flash memory device. However, this may cause increased retention in those erase blocks that are not retired. Therefore, according to certain embodiments of the present invention, instead of retiring part of the erase blocks within a device, the entire device is retired. An SSD contains several devices, say 16. Therefore, retiring one device at any given time yields $r=1/16$. Stored information is copied, or otherwise reproduced, from the retired device to the one that has just been taken out of retirement. It is appreciated that any references to "copying" in this specification are intended to include any method for reproduction of information. As this procedure only occurs following relatively long intervals of retirement (say >1 Hr), the effect on the performance of the SSD is low.

Figure 7A:
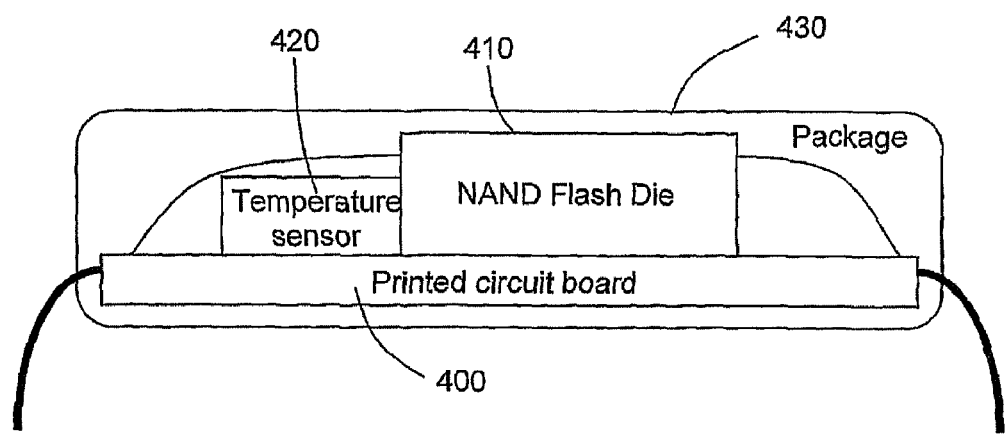
FIGS. 7A and 7B are respective side view and top view diagrams of a flash memory system constructed and operative in accordance with certain embodiments of the present invention, including a plurality of flash memory devices that allows each such device to be heated selectably and separately.

For this purpose, a system that allows heating every device separately is suitable. Each Flash memory device die is repackaged as shown in FIG. 7A. The Flash die 410 is placed on top of a printed circuit board 400. The printed circuit board has pads for connecting the die to the metal leads and a printed high resistance coil which is used to induce heat when current flows through it. In addition, the printed circuit board contains a heat sensor. Thus, the controller, apart from directly controlling the Flash memory device can also induce a current through the printed coil beneath the die which heats up. The heat sensor feeds back measurements to the controller which closes the loop. Thus, the controller may manage the heating duration and possibly the heating temperature.

Heating up a device (say by 50 degrees C.) greatly accelerates the de-trapping process (in the order of 100s of times). As the silicon die is less than 1 gram, heating it up by 50 degrees should require a limited amount of energy e.g. 10 mW. The corresponding low current should hardly be noticed in today's laptops. Given the cooling time period, Tcool., the trapping balance function can now be written as follows (formula IV):

$$f_{Trap\ balance}(C_s, C_d, r, T_r) = \sqrt{\frac{C_s + \left(\frac{1}{r} - 1\right) \cdot C_d \cdot (T_r + T_{cool})}{C_s}} \cdot (1 - \alpha_{Hot} \ln T_r)$$

Where $\alpha_{Hot}$ is the trap dissipation rate parameter when the die is hot.

As the de-trapping has been greatly accelerated, this allows using much lower rates and much lower cycling working points. That results in much weaker error correcting codes and much less redundancy.

Figure 13:
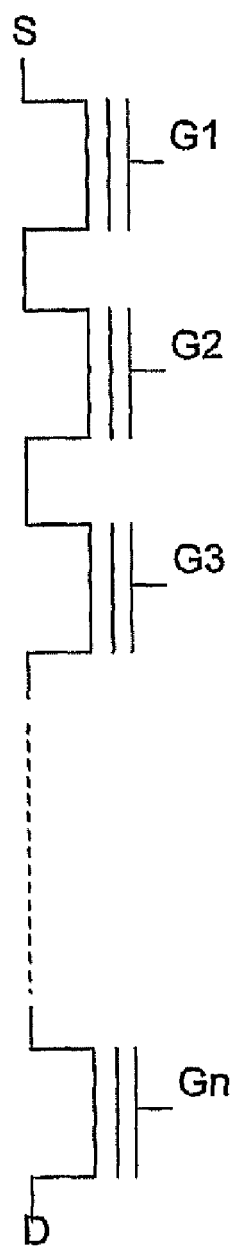
FIG. 13 is a simplified prior art electrical diagram of a conventional NAND Flash memories with serialized Flash memory cells arranged in strings, only one of which strings is shown for simplicity.

According to one embodiment of the present invention, cells may be heated individually, e.g. to accelerate the de-trapping phenomenon in those cells. One way to individually heat cells is by relying on a transistor structure available in NAND flash memory devices. Conventional NAND Flash memories serialize the Flash cells in strings, as shown in prior art FIG. 13. Each string may comprise 32 or 48 cells. The cells in a single string may be individually heated by inducing current through them. If enough current is induced for enough time, the power dissipating over the cells may turn into heat and de-trapping may occur. The power is a function of the voltage drop over the string and the current flowing through it. The current may be induced by applying a voltage differential between points D and S (say 5 V) and applying a positive voltage, say 5 V, at each of the gates (G1 through Gn). The amount of current may be controlled by varying the voltage applied at each of the gates.

Figure 7B:
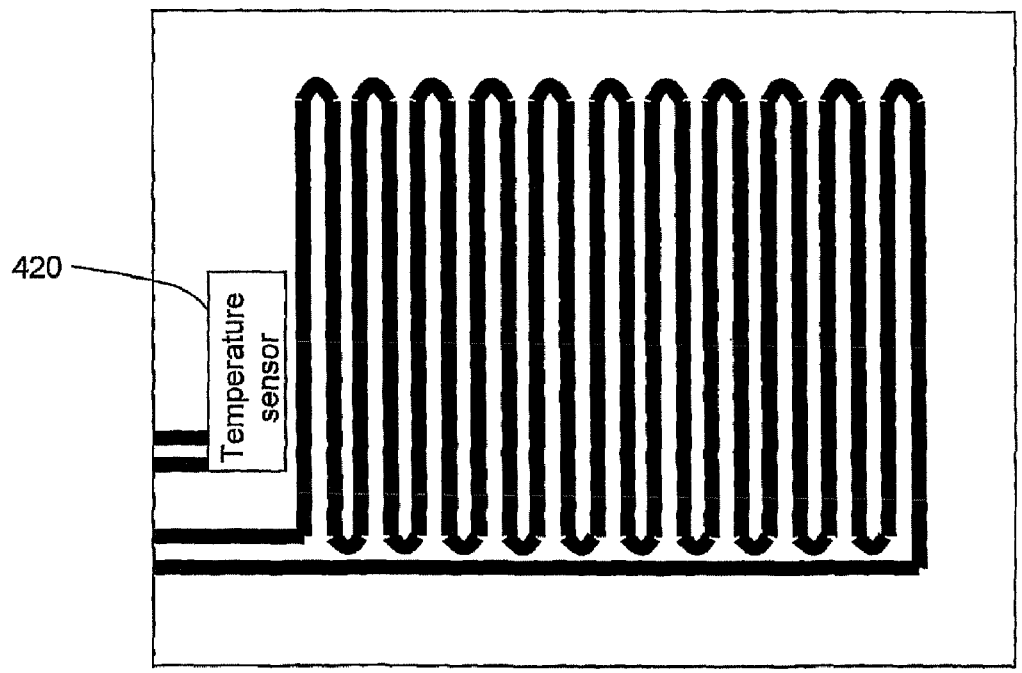
Figure 14:
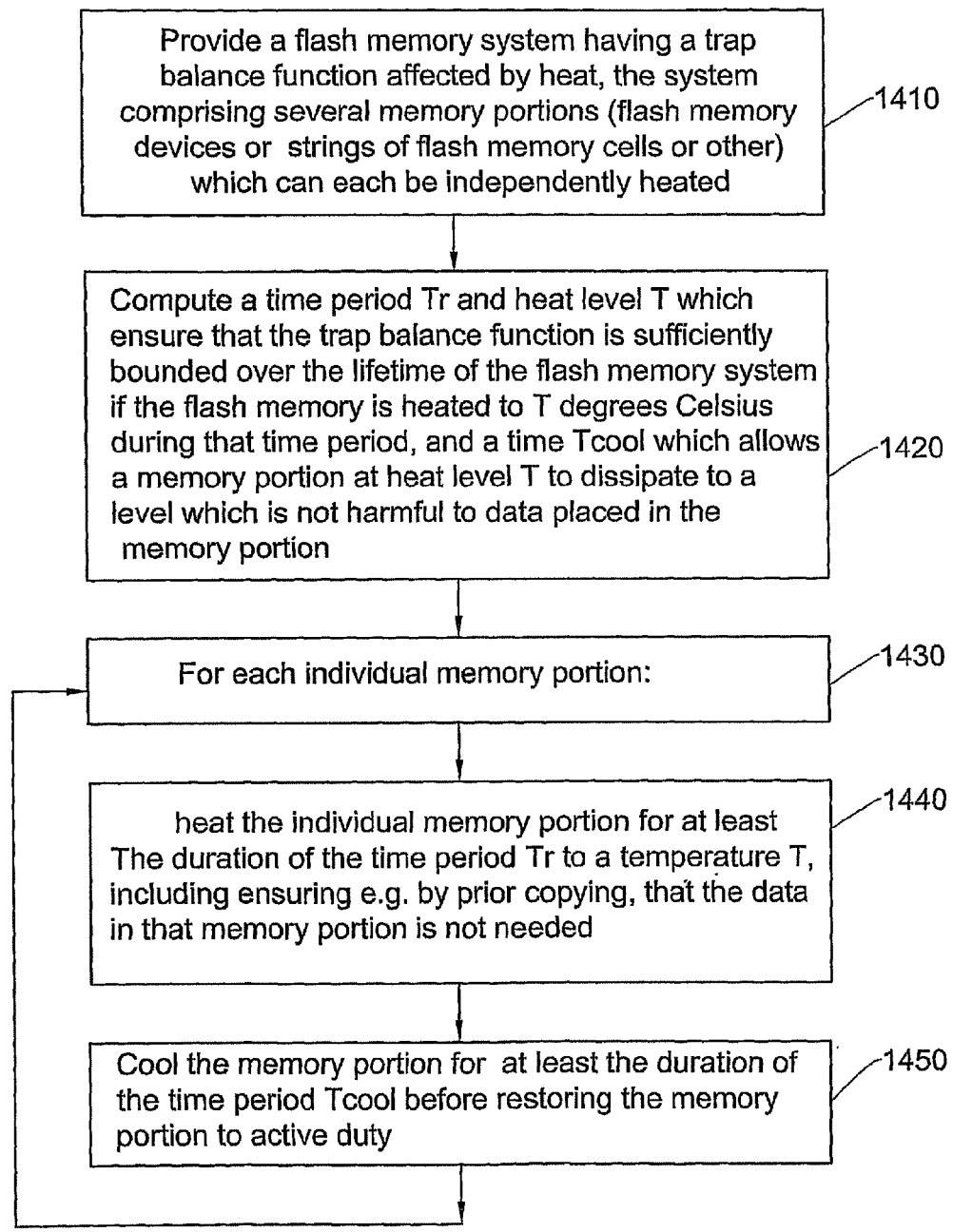
FIG. 14 is a simplified flowchart illustration of a method, constructed and operative in accordance with certain embodiments of the present invention, which is a variation on the method of FIG. 5A in which retirement comprises heating e.g. using the apparatus of FIGS. 7A and 7B.

FIG. 14 is a variation of FIG. 5A in which retirement comprises heating e.g. using apparatus of FIGS. 7A and 7B. The method of FIG. 14 typically comprises some or all of the following steps, suitably ordered e.g. as shown:

Step 1410: Provide a flash memory system having a trap balance function affected by heat, the system comprising several memory portions (flash memory devices or strings of flash memory cells or other) which can each be independently heated.

Step 1420: Compute a time period Tr which ensures that the trap balance function is sufficiently bounded over the lifetime of the flash memory system and a time Tcool.

Step 1430: For each individual memory portion (flash memory device or set thereof, string of flash memory cells or set thereof):

Step 1440: heat the individual memory portion, for at least the duration of the time period Tr including ensuring e.g. by prior copying, that the data in that memory portion is stored elsewhere.

1450: Cool the memory portion for at least the duration of the time period Tcool before restoring the memory portion to active duty Typically, an appropriate balance is maintained between the erase block retirement rate and redundancy considerations. The erase block retirement rate r determines how efficiently Flash memory is utilized. From a cost point of view, the smaller r is, the better, whereas the opposite is roughly the case from a performance point of view. The erase block retirement rate is defined as the proportion of erase blocks which are allocated for retirement at any one time.

An additional factor affecting Flash utilization is the amount of redundancy needed to make sure that the device works reliably following $$C_s + C_d \cdot T_r \cdot \left(\frac{1}{r} - 1\right)$$

program/erase cycles. In fact, there is a balance between the two factors. A lower erase block retirement rate r induces higher cycling counts $$C_s + C_d \cdot T_r \cdot \left(\frac{1}{r} - 1\right).$$

On the other hand, higher cycling counts induce higher error probabilities and hence the need for longer redundancies. Therefore, a balance is reached between the two factors as the goal is to enhance, e.g. optimize the overall utilization of the Flash memory devices.

One of the factors affecting the bit error rate following retention and cycling is the distribution variance. In general, the distribution variance is denoted by the function $\sigma^2(\text{Cycles}, T_{retention})$. Therefore, the variance is a factor which affects the size of the redundancy needed. This connection is expressed by $R(\sigma^2(\text{Cycles}, T_{retention}))$ where R is actually the ratio between the number of data bytes to the number of data and redundancy bytes (that is $$R = \frac{k}{n}$$

where k=number data bytes and n=number of data+redundancy bytes). The function itself depends on the type of code being used and an example is given later on. Using this function yields a balance which enhances, e.g. optimizes, the overall Flash utilization by solving the following optimization problem (formula V):

$$\max_{C_s, T_r, r} R\left(\sigma^2\left(C_s + \left(\frac{1}{r} - 1\right) \cdot C_d \cdot T_r, 10\ \text{Years}\right)\right) \cdot (1 - r)$$

$$\text{s.t.}\ f_{Trap\ balance}(C_s, C_d, r, T_r) < 1$$

In the above, "s.t." is "such that". The above optimization may, for example, be effected by exhaustive computerized search over suitable ranges of each of the variables, using suitable increments, such as for example: r between 0 and 1 in steps of 0.01, Tr between 0.1 Hour and 100 Hours in steps of 0.1 Hours and Cs between 1 and 1000 in steps of 1.

As already mentioned, in the Floating Gate flash model for sub 100 nm technologies, the variance of the cell threshold levels distributions are linearly dependent on the square root of the number of program erase cycles such that:

$$\sigma^2(\text{Cycles}, T_{retention}) = \beta_{Retention} \cdot \sqrt{\text{Cycles}} \qquad \text{(formula VI)}$$

where $\beta_{Retention}$ is a technology and retention time dependent parameter which may be approximated by:

$$\gamma(1 - \alpha \ln T_r) \cdot \alpha \ln T_r \qquad \text{(formula VII)}$$

Gamma may be determined experimentally whereas the trap dissipation rate may be as above.

As an example for computing $R(\sigma^2(\text{Cycles},T_{retention}))$, consider the binary BCH code. Assume that each block includes n bits (including data and redundancy). The BCH word size is $\lceil \log_2(n-1) \rceil$ bits. A code that corrects F bits may employ a redundancy of approximately $F \cdot \lceil \log_2(n-1) \rceil$ bits. The number of bits which need be corrected to obtain a certain probability of error per block, Pblock, depends on p, the bit error probability. F can be obtained by solving the following optimization problem (formula VIII):

$$F(p, P_{Block}) = \operatorname*{argmax}_{\text{s.t.} \sum_{i=F+1}^{n} p^i (1-p)^{n-i} < P_{block}} F$$

In the above, "s.t." is "such that". The above optimization may, for example, be effected by exhaustive computerized search over F, where F is enumerated between 0 and n in steps of 1.

p is a function of variance, e.g.:

$$\sigma^2(\text{Cycles}, T_{retention}) = \beta_{Retention} \cdot \sqrt{\text{Cycles}} \quad \text{(formula IX)}$$

given by:

$$p = \frac{2L-2}{L\log_2 L} Q\left(\frac{W}{2(L-1)\sqrt{\sigma^2(\text{Cycles}, T_{retention})}}\right) \quad \text{(formula X)}$$

where W is the voltage difference between the average highest program level's threshold voltage and lowest program level's threshold voltage, L is the number of program levels and it is assumed that bits are mapped into levels using Grey coding.

Therefore, a Binary BCH code $R(\sigma^2(\text{Cycles},T_{retention}))$ may be written as follows (formula XI):

$$R(\sigma^2(\text{Cycles}, T_{retention})) = \\ 1 - \frac{F\left(\frac{2L-2}{L\log_2 L} Q\left(\frac{W}{2(L-1)\sqrt{\beta_{Retention} \cdot \sqrt{\text{Cycles}}}}\right), P_{Block}\right) \lceil \log_2(n-1) \rceil}{n}$$

In summary, referring again to FIG. 4, according to certain embodiments of the invention, a relatively low level of redundancy, compared to prior art systems, is employed, to take into account reduction in number of anticipated errors due to introduction of the retirement scheme in accordance with certain embodiments of the present invention. According to these embodiments, step 215 of FIG. 4 typically comprises the following steps:

a. determine Cd according to application For example, a solid state disk may require 6 cycles a day whereas Camerase applications may require much less.

b. maximize the redundancy R using Formula V and set the cycling working point Cs, retirement time period Tr and retirement rate r to be those values which maximize the redundancy R in accordance with Formula V.

Then, step 220 of FIG. 4 typically comprises the following steps:

c. compute σ2, using formula IX d. determine desired page error rate (the proportion of pages in which the number of errors exceeds the maximal number of errors that the error correction code is designed to correct) e.g. 5×10 exp (−13).

e. determine F, the number of errors to be corrected. For example, if each page includes 17408 bits and the desired page error rate is 5×10 exp (−13) and there is a mistake each 1000 bits, then according to Formula VIII, F=59 errors per page are to be corrected.

f. Use the above results to determine redundancy R in accordance with Formula XI.

Figure 15:
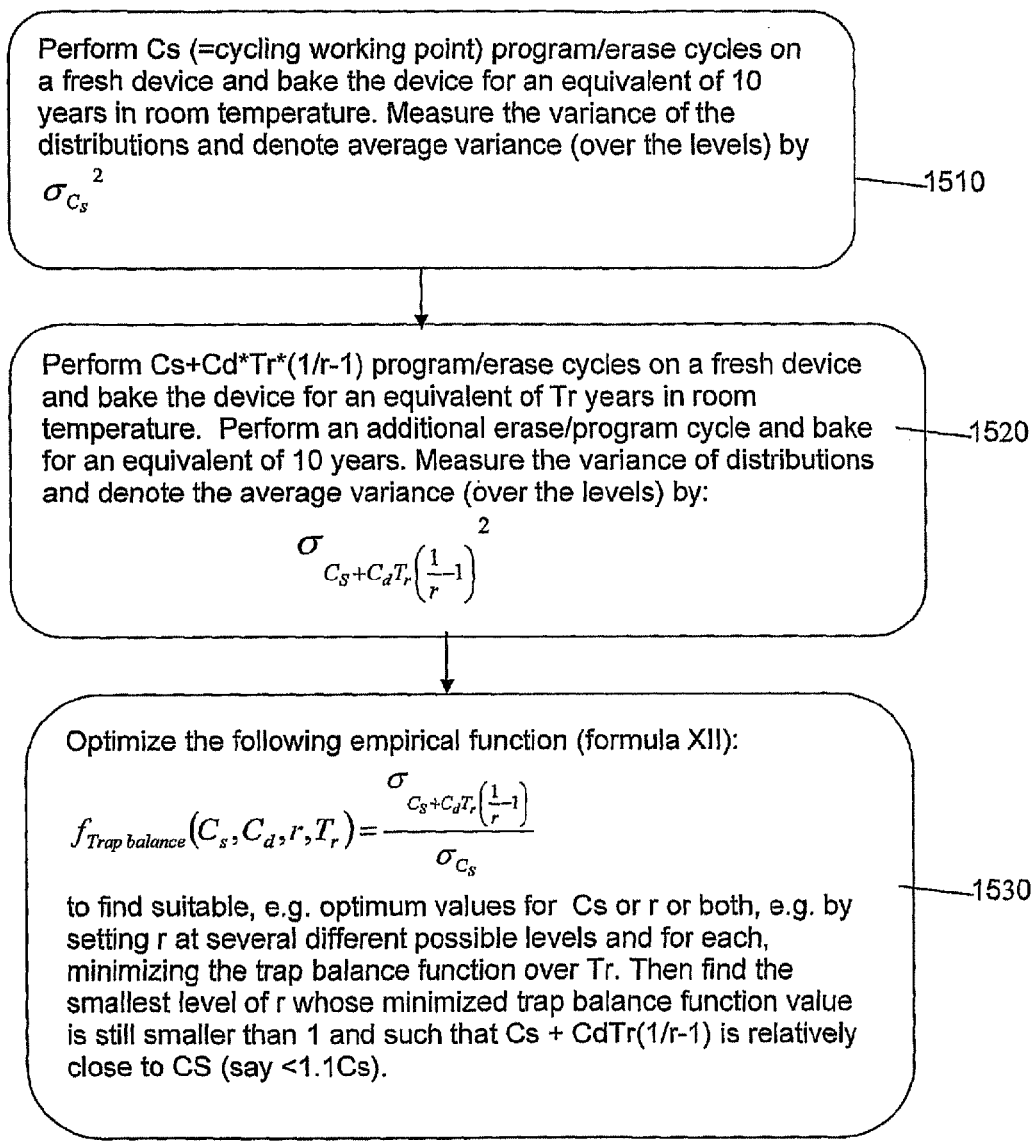
FIG. 15 is a simplified flowchart illustration of a method, constructed and operative in accordance with certain embodiments of the present invention, for computing retirement parameters such as cycling working point and retirement rate, suitable for implementing step 215 of FIG. 4 for NROM flash memory device technologies.

Referring now to FIG. 15, certain embodiments of this invention may also be applicable to NROM technologies characterized in that retirement allows the device to recover from the effect of cycling. In this case, suitable values for retirement parameters is such as cycling working point Cs and/or retirement rate r may be computed (step 215 of FIG. 4) using an empirical trap balance function. A method for computing retirement parameters such as cycling working point and retirement rate, suitable for implementing step 215 of FIG. 4 for NROM flash memory device technologies, is described herein with reference to FIG. 15.

The method of FIG. 15 typically comprises some or all of the following steps, suitably ordered e.g. as shown:

1510. Perform program/erase cycles on a fresh device and bake the device for an equivalent of 10 years in room temperature. Measure the variance of the distributions and denote average variance (over the levels) by $\sigma_{C_s}^2$.

1520. Perform Cs+Cd*Tr*(1/r−1) program/erase cycles on a fresh device and bake the device for an equivalent of Tr years in room temperature. Perform an additional erase/program cycle and bake for an equivalent of 10 years. Measure the variance of distributions and denote the average variance (over the levels) by:

$$\sigma_{C_s+C_dT_r(\frac{1}{r}-1)}^2.$$

Optimize the following empirical function (formula XII):

$$f_{Trap\ balance}(C_s, C_d, r, T_r) = \frac{\sigma_{C_s+C_dT_r(\frac{1}{r}-1)}}{\sigma_{C_s}},$$

to find suitable, e.g. optimum values for Cs or r or both. The above optimization may, for example, be effected by exhaustive computerized search over suitable ranges of each variable, using suitable increments for each.

Although the example of Solid State Disks has been considered here, this specification is not limited to this application. For example, the methods presented here may also be used for extending the capabilities of memory cards used in Camera and other portable devices. Uses such as a camera card have a small cycling requirement (i.e. Cd is small). Therefore, even a modest retirement rate r may extensively prolong the life of a card (say extending it from 10 to 1K cycles). A particular feature of certain embodiments of the present invention is that natural processes occurring over time in flash memory, such as de-trapping, become an asset rather than a liability. This is particularly the case for natural processes which rejuvenate a flash memory portion only if, or more successfully and completely if, that flash memory portion is inactive e.g. only if it does not undergo writing and/or erasing. This feature is now described using de-trapping as an example, although it is appreciated that the applicability of the invention is in no way dependent on the occurrence, or even the extent of occurrence, of de-trapping specifically.

In conventional flash memory systems in which no portion of memory is ever afforded retired status, de-trapping is a liability because it adversely affects reliability of data. In the flash memory systems shown and described herein, in contrast, de-trapping becomes an asset because once a flash memory portion containing many traps has undergone de-trapping for a duration, perhaps even at an enhanced rate induced e.g. by heating, that flash memory portion's ability to store data reliably is restored since the number of existing traps therein is reduced, perhaps even greatly reduced e.g. if the portion has been heated, by virtue of de-trapping, whereas substantially no new traps are formed due to suspension of any programming or erasing operations in that portion. On the other hand, the adverse effects of de-trapping, namely reduced data reliability, are neutralized by refraining from using the data which was present during the de-trapping process, both during this process and afterward. Instead this data is erased. If the data is still needed, a copy thereof, created before erasure, is subsequently used.

It is appreciated that the specific formulae presented herein each represent only one possible way of selecting appropriate parameters for managing retirement of memory portions in accordance with various embodiments of the present invention and are not intended to be limiting.

Certain operations are described herein as occurring in the microcontroller internal to a flash memory device. Such description is intended to include operations which may be performed by hardware which may be associated with the microcontroller such as peripheral hardware on a chip on which the microcontroller may reside. It is also appreciated that some or all of these operations, in any embodiment, may alternatively in be performed by the external, host-flash memory device interface controller including operations which may be performed by hardware which may be associated with the interface controller such as peripheral hardware on a chip on which the interface controller may reside. Finally it is appreciated that the internal and external controllers may each physically reside on a single hardware device, or alternatively on several is operatively associated hardware devices.

Any data described as being stored at a specific location in memory may alternatively be stored elsewhere, in conjunction with an indication of the location in memory with which the data is associated. For example, instead of storing page- or erase-sector-specific information within a specific page or erase sector, the same may be stored within the flash memory device's internal microcontroller or within a microcontroller interfacing between the flash memory device and the host, and an indication may be stored of the specific page or erase sector associated with the cells.

It is appreciated that the teachings of the present invention can, for example, be implemented by suitably modifying, or interfacing externally with, flash controlling apparatus. The flash controlling apparatus controls a flash memory array and may comprise either a controller external to the flash array or a microcontroller on-board the flash array or otherwise incorporated therewithin. Examples of flash memory arrays include Samsung's K9XXG08UXM series, Hynix's HY27UK08BGFM Series, Micron's MT29F64G08TAAWP or other arrays such as but not limited to NOR or phase change memory. Examples of controllers which are external to the flash array they control include STMicroelectrocincs's ST7265x microcontroller family, STMicroelectrocincs's ST72681 microcontroller, and SMSC's USB97C242, Traspan Technologies' TS-4811, Chipsbank CBM2090/CBM1190. Example of commercial IP software for Flash file systems are: Denali's Spectra™ NAND Flash File System, Aarsan's NAND Flash Controller IP Core and Arasan's NAND Flash File System. It is appreciated that the flash controller apparatus need not be NAND-type and can alternatively, for example, be NOR-type or phase change memory-type.

Flash controlling apparatus, whether external or internal to the controlled flash array, typically includes the following components: a Memory Management/File system, a NAND interface (or other flash memory array interface), a Host Interface (USB, SD or other), error correction circuitry (ECC) typically comprising an Encoder and matching decoder, and a control system managing all of the above.

The present invention may for example interface with or modify, as per any of the embodiments described herein, one, some or all of the above components and particularly the Memory management/Filing system which, according to certain embodiments of the present invention, has a block allocation/"garbage collection" functionality useful for implementing retirement plans such as those shown and described herein.

It is appreciated that software components of the present invention including programs and data may, if desired, be implemented in ROM (read only memory) form including CD-ROMs, EPROMs and EEPROMs, or may be stored in any other suitable computer-readable medium such as but not limited to disks of various kinds, cards of various kinds and RAMs. Components described herein as software may, alternatively, be implemented wholly or partly in hardware, if desired, using conventional techniques.

Included in the scope of the present invention, inter alia, are electromagnetic signals carrying computer-readable instructions for performing any or all of the steps of any of the methods shown and described herein, in any suitable order; machine-readable instructions for performing any or all of the steps of any of the methods shown and described herein, in any suitable order; program storage devices readable by machine, tangibly embodying a program of instructions executable by the machine to perform any or all of the steps of any of the methods shown and described herein, in any suitable order; a computer program product comprising a computer useable medium having computer readable program code having embodied therein, and/or including computer readable program code for performing, any or all of the steps of any of the methods shown and described herein, in any suitable order; any technical effects brought about by any or all of the steps of any of the methods shown and described herein, when performed in any suitable order; any suitable apparatus or device or combination of such, programmed to perform, alone or in combination, any or all of the steps of any of the methods shown and described herein, in any suitable order; information storage devices or physical records, such as disks or hard drives, causing a computer or other device to be configured so as to carry out any or all of the steps of any of the methods shown and described herein, in any suitable order; a program pre-stored e.g. in memory or on an information network such as the Internet, before or after being downloaded, which embodies any or all of the steps of any of the methods shown and described herein, in any suitable order, and the method of uploading or downloading such, and a system including server/s and/or client's for using such; and hardware which performs any or all of the steps of any of the methods shown and described herein, in any suitable order, either alone or in conjunction with software.

Features of the present invention which are described in the context of separate embodiments may also be provided in combination in a single embodiment. Conversely, features of the invention, including method steps, which are described for brevity in the context of a single embodiment or in a certain order may be provided separately or in any suitable subcombination or in a different order. "e.g." is used herein in the sense of a specific example which is not intended to be limiting.

The invention claimed is:

1. Flash memory apparatus including:
a plurality of memory portions;
a controller operative to reserve for data retention purposes, for at least a first duration of time, only certain portions from among said plurality of memory portions;
wherein the controller is arranged to: allocate data, during said first duration of time, only to said certain memory portions, thereby to define at least one of the plurality of memory portions other than to said certain portions as a retired memory portion for said first duration of time; and
a heating system heating at least one retired memory portion;
wherein said plurality of memory portions comprises at least two flash memory devices and wherein said heating system comprises at least one heater configured and arranged to selectively heat only a subset of said at least two flash memory devices and wherein said controller selectively defines all memory portions included in said sub set as retired memory portions.

* * * * *